United States Patent
Brommer et al.

(10) Patent No.: US 8,295,767 B2
(45) Date of Patent: Oct. 23, 2012

(54) METHOD OF MANUFACTURING A MICRORADIO

(75) Inventors: Karl D. Brommer, Exeter, NH (US); Tracey H. Brommer, Exeter, NH (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 0 days.

(21) Appl. No.: 13/183,679

(22) Filed: Jul. 15, 2011

(65) Prior Publication Data

US 2011/0265314 A1      Nov. 3, 2011

Related U.S. Application Data

(62) Division of application No. 11/578,275, filed on Jul. 30, 2007, now Pat. No. 8,010,048.

(51) Int. Cl.
*H04B 7/00* (2006.01)
*H01L 21/00* (2006.01)

(52) U.S. Cl. .................. 455/41.2; 438/460; 427/290

(58) Field of Classification Search ........ 455/41.1–41.2; 216/13; 427/289–290; 438/460
See application file for complete search history.

(56) References Cited

U.S. PATENT DOCUMENTS

| | | | |
|---|---|---|---|
| 5,153,583 A | 10/1992 | Murdoch | |
| 5,273,939 A | 12/1993 | Becker et al. | |
| 5,305,008 A | 4/1994 | Turner et al. | |
| 6,211,786 B1 | 4/2001 | Yang et al. | |
| 6,259,372 B1 | 7/2001 | Taranowski et al. | |
| 6,282,407 B1 | 8/2001 | Vega et al. | |
| 6,781,696 B1 * | 8/2004 | Rosenberger et al. | 356/437 |
| 7,546,092 B1 | 6/2009 | Murdoch | |
| 2003/0234730 A1 | 12/2003 | Arms et al. | |
| 2004/0041714 A1 | 3/2004 | Forster | |
| 2004/0233174 A1 * | 11/2004 | Robrecht et al. | 345/173 |
| 2005/0051511 A1 * | 3/2005 | Ke et al. | 216/13 |
| 2005/0251995 A1 * | 11/2005 | Kawamura et al. | 29/609.1 |
| 2006/0270093 A1 * | 11/2006 | Noma et al. | 438/64 |
| 2009/0283599 A1 * | 11/2009 | Okamoto et al. | 235/439 |

OTHER PUBLICATIONS

Kurokawa, "Injection Locking of Microwave Solid-State Oscillators", Proceedings of the IEEE, vol. 16, No. 10, Oct. 1973 (28 pages).
Lindsey et al., "Mutual Synchronization Properties of a System of Two Oscillators with Sinusoidal Phase Detectors", IEEE Transactions on Communications, Dec. 1976 (6 pages).

(Continued)

*Primary Examiner* — Nguyen Vo
(74) *Attorney, Agent, or Firm* — Daniel J. Long; Robert K. Tendler

(57) ABSTRACT

A microradio is provided with a hysteretic switch to permit an optimum range increasing charging cycle, with the charging cycle being long relative to the transmit cycle. Secondly, an ensemble of microradios permits an $n^2$ power enhancement to increase range with coherent operation. Various multi-frequency techniques are used both for parasitic powering and to isolate powering and transmit cycles. Applications for microradios and specifically for ensembles of microradios include authentication, tracking, fluid flow sensing, identification, terrain surveillance including crop health sensing and detection of improvised explosive devices, biohazard and containment breach detection, and biomedical applications including the use of microradios attached to molecular tags to destroy tagged cells when the microradios are activated. Microradio deployment includes the use of paints or other coatings containing microradios, greases and aerosols. Moreover, specialized antennas, including microcoils, mini dipoles, and staircase coiled structures are disclosed, with the use of nanodevices further reducing the size of the microradios.

20 Claims, 23 Drawing Sheets

OTHER PUBLICATIONS

Van Der Pol, "The Nonlinear Theory of Electric Oscillations", Proceedings of the Institute of Radio Engineers, vol. 11, No. 9, Sep. 1934 (26 pages).

Blaquere, "Nonlinear Oscillators and the Nyguist Diagram", J. Phys. Radium 13, 527-540 (1952) (15 pages).

Schlosser, "Noise is Mutually Synchronized Oscillators", IEEE Transactions on Microwave Theory and Techniques, vol. MIT-16, No. 9, Sep. 1968 (6 pages).

Gersho et al., Mutual Synchronization of Geographically Separated Oscillators, Bell Syst. Tech. J., vol. 45, Dec. 1966 (17 pages).

* cited by examiner

502 — Paint Sprayer
500 — Microradio Slurry Carrier
504
506 — Surface

METHOD OF MANUFACTURING A MICRORADIO

RELATED APPLICATIONS

This application is a divisional of and claims the benefit of priority to prior U.S. patent application Ser. No. 11/578,275, by inventors Karl D. Brommer et al., entitled "Microradio Design, Manufacturing Method and Applications for the Use of Microradios", which claims rights under 35 USC §119(e) from U.S. Patent Application Ser. No. 60/645,079 filed Jan. 20, 2005; U.S. Patent Application Ser. No. 60/645,221 filed Jan. 20, 2005; U.S. Patent Application Ser. No. 60/645,222 filed Jan. 20, 2005; U.S. Patent Application Ser. No. 60/645,223 filed Jan. 20, 2005; U.S. Patent Application Ser. No. 60/645,224 filed Jan. 20, 2005; U.S. Patent Application Ser. No. 60/645,226 filed Jan. 20, 2005; and U.S. Patent Application Ser. No. 60/645,227 filed Jan. 20, 2005. This Application may also be considered to be related to U.S. Application Ser. No. 60/711,217 filed Aug. 25, 2005; U.S. Application 60/711,314 filed Aug. 25, 2005; U.S. Application 60/711,218 filed Aug. 25, 2005; U.S. Application 60/711,325 filed Aug. 25, 2005; U.S. Application 60/722,309 filed Sep. 30, 2005; U.S. Application 60/726,145 filed Oct. 13, 2005; and U.S. Application 60/726,146 filed Oct. 13, 2005.

FIELD OF THE INVENTION

This invention relates to microradios and more particularly to the design, manufacture and use of microradios.

BACKGROUND OF THE INVENTION

The size of radios, meaning combined transmitters and receivers, has been steadily decreasing so that their use, for instance, in RF tags is now commonplace. It will be appreciated that each RF tag has a single small or miniature radio that in general costs approximately 50 cents. All of these RF tags are meant to be used to tag items and to be able to detect the items when they pass through a checkpoint. The costs of such tags and applications for even smaller tags give rise to the possibility of a large number of applications should, for instance, the radios be implementable well below a cubic millimeter in size and more particularly down to a 10-micron cube.

Moreover, the power output of such single microradios leaves something to be desired inasmuch as single microradios are limited in output power, especially when using parasitic powering schemes. Moreover, in order to parasitically power such miniature radios one needs supercapacitor technology involving high energy density capacitors fabricated in a regular pattern with a large surface area per volume.

It will be appreciated that if the microradio needs to have a given power output to obtain a given range, then the range is severely limited both by the ability to provide supercapacitors or, if a battery is carried on board, then the size of the miniature radio is prohibitively large.

Were it possible to make large numbers of microradios in the 10-micron size range and were it possible to distribute these radios across an area; and further if the radios could be accessed so as to provide their outputs in a coherent fashion, then the distributing of these radios over a given area would have an $n^2$ power advantage such that if it were possible to manufacture, code and distribute 1,000 radios in a given area, one would have a million more times the radiated power.

By causing each of the radios to coherently radiate, one can increase range or concurrently decrease the need for tuning each of the radios to their antennas. There is therefore a benefit in providing an ensemble of a large number of miniature radios from the point of view of, for instance, being able to detect the radios at 10,000 kilometers or better, such as by satellite.

The ability to produce hundreds of thousands or millions of radios at a time not only is important to reduce the cost of the radios from, for instance, 50 cents per radio to $1.00 per million radios, it is also important that one be able to utilize non-high density capacitors that presently exist in order to power the miniature radios parasitically. Because batteries cannot be made sufficiently small, one requires that a microradio be powered parasitically, meaning that energy that is available from the environment is captured on a capacitor, where it is rectified and utilized to power the transceiver.

Thus it would be desirable to provide a parasitically powered microradio, parasitically coupled to some decent antenna, with the microradio having its own microantenna.

Even in the case that each radio is not particularly well-tuned to whatever antenna it is using, the ability to produce large numbers of extremely inexpensive microradios and randomly distribute them across a surface that could function as an antenna could result in at least a large portion of the miniature radios being located at the feedpoint of whatever antenna is available. Thus, if one can distribute the radios across a surface in some random fashion, then the probability of there being a microradio at an antenna feedpoint is large for at least a certain percentage of the distributed radios.

Thus if it were possible to manufacture millions of microradios inexpensively and distribute them across a surface, and assuming the surface had some natural antenna such as a slot in a metal object, or the dielectric as provided by the human or an animal body and the salt therein, or a ferromagnetic body, then one could obtain a sufficiently usable signal that could be detected anywhere from numbers of feet to many thousands of kilometers away, even with the minute power outputs from each of the individual microradios.

As a further consideration of power it will be appreciated that if the transmit cycle for the radio could be reduced to a small portion of a prolonged charging cycle, then it would be possible to deploy such numbers of microradios without concern about power. This is due to the relatively long charging time available for the capacitors utilized for each of the microradios versus the short amount of time necessary to transmit information.

Moreover, were it possible to reliably manufacture such microradios on a very large scale, there are applications in tagging and authentication as well as anti-piracy and medical applications for which such tiny microradios or ensembles of microradios could be used.

SUMMARY OF INVENTION

In the subject invention, there are improvements to the microradios and antennas themselves, a method of manufacture, systems for improving parasitic powering and transmitter range, providing ensembles of microradios, deployment of the ensembles in paints or other coatings containing microradios, aerosol sprays and liquid carriers, and a number of applications for such radios.

As will be discussed, the subject invention involves improvements that enhance the parasitic powering of the microradios so that they can be powered by low-level ambient radiation or by direct radiation. This involves a powering/transmit cycle in which the power accumulates on a capacitor over a long period of time and is then read out to an oscillator just sufficient to sustain a brief modulated burst. This is unlike the RFID tags that act as smart retro-reflectors, which do not transmit stored parasitically developed energy but rather immediately use the power from incident radiation. What the subject parasitic powering process does is to store energy derived from the environment. This permits separating the reader from the power source and gives rise to applications in which energy in the ambient can be used to power a microradio. In this scenario, energy collected over time on a capacitor is used to power the microradio to occasionally put out a signal burst that can be detected from a position removed from the parasitic source of power, such as by an overflying aircraft or satellite.

This powering scheme in which power is built up and stored on a capacitor utilizes a hysteretic switch that permits the microradio to absorb ambient radiation over a long period of time until such time as a capacitor is sufficiently charged, after which the power from the capacitor is coupled to the oscillator that emits a signal burst. For the purposes of this invention a "hysteretic switch" is a switch that allows conduction of electrical current when a threshold voltage is reached and which continues to allow conduction of electrical current until a second lower threshold voltage is reached, at which time conduction ceases. One simple example of a hysteretic switch is a transistor that is forced into conduction when the capacitor voltage reaches some predetermined level. Thereafter the capacitor is coupled to the oscillator of the microradio for the signal burst. In this case the oscillator is automatically and cyclically fired off. Because the exact timing of the signal blast is not important in most cases, it is acceptable to signal only occasionally.

Since the detector or reader is separate from the power source, which in this case is the ambient, one could surveil an area at a distance by flying over it and detecting the information occasionally transmitted by the microradio.

Thus, rather than utilizing an RFID tag smart reflector that is able to modulate its reflection, the subject hysteretic switch microradio offers considerable flexibility in its use and makes it possible for very low ambient power to charge the microradio capacitor. When the microradio has enough energy it can be automatically fired off to deliver a relatively large amount of power that can be detected by a distant collector, unlike short-range RFID tags.

Moreover, it is part of the subject invention that it has been found that there is enough RF energy in the ambient to charge a microradio when operated in this regime, whether the ambient contains ambient RF energy or ambient light.

Secondly, the subject microradios can be made particle sized and extremely inexpensively so that massive numbers can be distributed over a surface that either has some natural radiative structure or includes an antenna with a feedpoint. In the case of a naturally radiative structure such as a metal surface with a slot or even a dielectric composed of animal tissue, dispersing a large number of microradios on the structure results in at least some of the microradios being optimally located relative to the naturally radiating surface. In one embodiment this means that some of the microradios will be located at the feedpoints of what could constitute antennas of the naturally radiating structure. The random distribution of the microradios across the structure thus provides that at least some of the radios will optimally couple ambient power to the microradio as well as providing an optimal coupling of output power from the microradio to the ambient. Thus capacitor charging and radiating power are maximized by providing an ensemble of microradios.

By random microradio positioning, one has a faster charging time and a longer range for at least some of the microradios. This is because a random distribution optimally places some microradios at an antenna feedpoint.

Moreover, when the radios are strobed so as to cause a coherent response, the output power is increased by $n^2$, such that even if powered by the ambient, the radios can be heard from as far away as 10,000 kilometers, e.g., satellites.

As another feature of the subject invention, the dispersing of the radios in the vicinity of the feedpoint of an already-existing antenna makes unnecessary the previously critical, costly placement of the microradio at the antenna.

Additionally, with the use of the subject charging/transmission cycles and the use of multiple particle-like microradios one can avoid the requirement for supercapacitors to increase power and range.

In short, one can provide RFID tags without the expense of accurately placing a circuit on an antenna. Moreover, one can provide an RFID tag at $\frac{1}{50}^{th}$ the cost, with better range and better charging.

As part of the subject invention, one can manufacture the microradio particles utilizing standard semiconductor processing techniques, in which the microradios can be patterned on a wafer, diced and distributed in a liquid or aerosol spray, or by dispersing, suspending or entraining the microradios in a suitable paint or other coating.

Additionally, the subject invention includes the option of providing specialized antennas, including microscopic dipoles, microcoils, and magnetic dipoles that can be fabricated in sizes commensurate with the size of the microradio itself.

Furthermore, since all of the microradios use rectifiers and since the rectifiers have diodes with input voltage thresholds, it has been found that providing active radiation at different frequencies results in a combined voltage output exceeding critical diode voltage thresholds. This further increases the ability to power the microradios with low ambient energy. Of course, all of the above techniques for more effectively coupling ambient energy into the microradios help to overcome the diode voltage thresholds.

Moreover, with the above-mentioned coherent operation of the microradios, the $n^2$ power increase results in extremely long-range detectability.

In summary, such flexibility permits the use of even crude, inefficient microradios in a large number of applications, including RFID tags, location detection, authentication, remote sensing of large areas for, for instance, crop health and the presence of hazardous chemicals or metallic objects, as well as applications involving sensing fluid flow parameters in both large pipes and in blood vessels, with medical applications including drug delivery through the activation of a microradio, for instance attached to a molecular tag, with the microradio being powered by ambient or directed radiation.

More specifically, the subject microradios are provided with capacitor leak protection afforded by the hysteresis switch, so that they can be charged up to store energy for release later in a burst. Specialized antennas can be used or natural radiative structures are available, such as naturally occurring slot antennas; or human or animal tissue provides a dielectric radiative structure that contain enough salt to provide the dielectric with requisite conductivity.

Secondly, the subject invention includes deploying large numbers of crude, inexpensive microradios over a given area. With large numbers of radios, although randomly distributed over a structure, there will be radios at favorable locations, in one embodiment at or close to an antenna feedpoint.

Moreover, ensembles of such radios can be used for a wide variety of purposes such as for authentication, identification, tracking and even for biomedical purposes such as biologic parameter sensing and drug delivery.

Importantly, the microradios can be manufactured in a high-density process on large wafers, after which they are separated into millions of 10-micron particles, each serving as a microradio. These particle microradios can be programmed en masse and can be made to coherently radiate to provide an $n^2$ power boost that can extend the range of the microradios up to 10,000 kilometers.

Most importantly, the cost of a million microradios manufactured as discussed above can be brought down to a dollar or less so that providing massive numbers of such radios is much less costly than using a single microradio.

Thus the ability to provide improved microradios in a high-yield process permits applications as diverse as spraying a field for crop health information, or an area to detect a wide variety of terrorist threats. Both consumer and commercial parts of any kind can be sprayed with paint or other coating containing microradios for anti-piracy purposes, as well as to provide for a much more cost effective RFID. Moreover, tracking and other functions are made feasible and inexpensive with the use of the ensemble of microradios provided by the subject technology.

As will be appreciated, in the subject invention a parasitically powered microradio is fabricated on a standard wafer, is cut and is made available for deployment either in an aerosol, in a paint or other coating containing microradios, or in some liquid dispersion such that the microradios can be distributed over a surface of interest, be it an electronic or mechanical part, a field or other terrain; or in or on containers to track and count inventories, and for authentication purposes.

While some portions of each microradio may involve nanostructures such as nanotube resonators or even carbon nanotube electronics, the subject invention is not limited to nanotechnology. Nor is it limited to a particular high energy density capacitor technology.

The only requirement is that the microradio be parasitically powered. Thus it is the intent of the subject invention that one manufacture a small circuit that is parasitically coupled to its environment.

In summary, a microradio is provided with a hysteretic switch to permit an optimum range increasing charging cycle, with the charging cycle being long relative to the transmit cycle. Secondly, an ensemble of microradios permits an $n^2$ power enhancement to increase range with coherent operation. Various multi-frequency techniques are used both for parasitic powering and to isolate powering and transmit cycles. Applications for microradios and specifically for ensembles of microradios include authentication, tracking, fluid flow sensing, identification, terrain surveillance including crop health sensing and detection of improvised explosive devices, biohazard and containment breach detection, and biomedical applications including the use of microradios attached to molecular tags to destroy tagged cells when the microradios are activated. Microradio deployment includes the use of suitable paints or other coatings, greases and aerosols. Moreover, specialized antennas, including microcoils, mini dipoles, and staircase coiled structures are disclosed, with the use of nano-devices further reducing the size of the microradios.

For the purposes of this invention the term "microradio" means a radio having nano-size elements or dimensions up to a dimension of about 4 mm×4 mm.

BRIEF DESCRIPTION OF THE DRAWINGS

These and other features of the subject invention will be better understood in connection with the Detailed Description, in conjunction with the Drawings, of which:

FIG. 22 is a diagrammatic illustration of the generation of a paint or other coating containing microradios, including the provision of microradios in a carrier that is dispersed either by aerosol or paint sprayer onto a surface;

FIG. 23 is a diagrammatic illustration of the deployment of an aerosol over an area such as a wheat field or other crop for detecting crop health;

DETAILED DESCRIPTION

Figure 1:
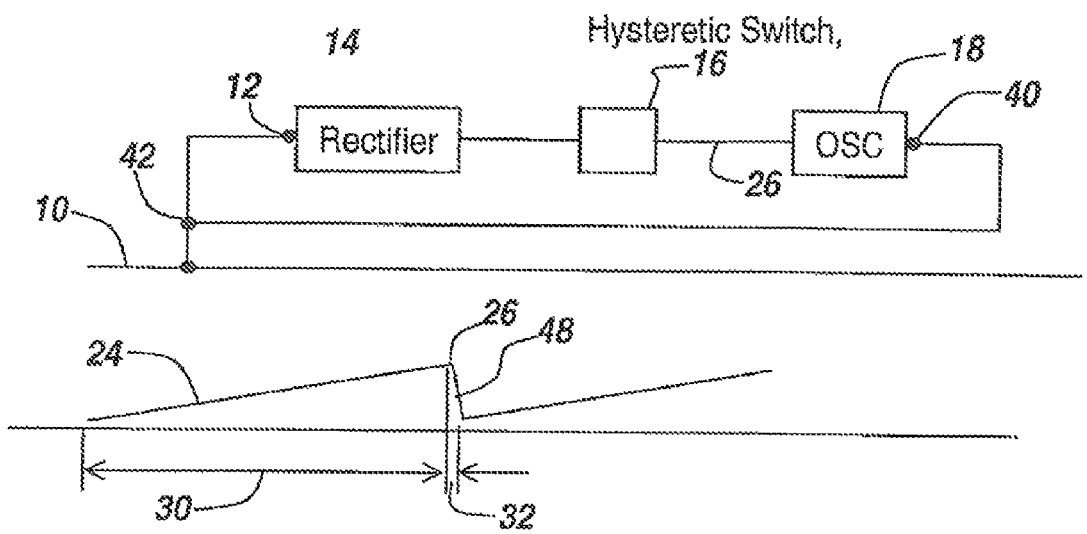
FIG. 1 is a block diagram showing the subject microradio, which includes a rectifier, a hysteretic switch and an oscillator, coupled to a naturally radiative structure such that the microradio may be powered parasitically and transmit its information back through the naturally radiative structure.

Referring now to FIG. 1 and prior to discussing applications of microradios, in its simplest configuration the radio is parasitically coupled to the environment through a connection to a metal or dielectric structure that functions as a naturally radiating structure, here illustrated at 10. The microradio has an input 12 coupled to structure 10, at which point a rectifier 14 rectifies RF energy or optical energy to be able to power a radio through a hysteretic switch 16 coupled between the rectifier and an oscillator 18. As will be described, oscillator 18 will transmit an information-bearing waveform. A variety of analog and digital modulations may be employed, including frequency modulation (FM), amplitude modulation (AM), binary phase shift key (BPSK) and binary frequency shift key (BFSK), among other possibilities.

It is the purpose of hysteretic switch 16 to toggle the power from rectifier 14 to oscillator 18. In one embodiment, the output of oscillator 18 is an encoded signal available at output 40 coupled back to structure 10 at point 42.

In operation, an RF or optical signal impinges on structure 10 and is rectified by rectifier 14 to charge its final capacitor. The capacitor is contained in the rectifier, or between the rectifier and the hysteretic switch. Once the incoming power is rectified and switch 16 has fired, power is applied to oscillator 18, for instance over line 26. Thus, by projecting RF or optical energy onto structure 10, oscillator 18 is powered and produces the required signal.

However, the amount of power that can be extracted from the environment using a structure 10 is usually not sufficient to power oscillator 18 for an indeterminate length of time. Moreover, the diodes in rectifier 14 have thresholds that must be overcome in order for the rectifier to work.

More particularly, when powering a microradio parasitically, one of the first and foremost considerations is the rectifier that takes the RF or optical energy at the microradio and converts it into DC power. One of the challenges for rectifiers is that their diodes have a minimum onset or threshold voltage. As a result one is limited in the forward link in charging the capacitors of the microradio if the detected energy is insufficient to overcome the diode threshold. For instance, it is much harder to charge a microradio than to listen to it or hear it. In other words, practical charging ranges for the radio capacitor are typically much less than typical detection ranges for radio oscillator transmissions. Were the two ranges comparable, it would be found that passive radio tagging range equations would be similar to a radar range equation in the sense that the power returned is proportional to the power transmitted times the power reflected, resulting in a $1/r^4$ dependence in which power received back at the transmitter is proportional to power transmitted divided by range to the fourth power. However, due to capacitor charging being less efficient, it is found that power received in the capacitor is proportional to power transmitted divided by range squared, given that once the rectifier receives sufficient power to enable forward diode conduction and capacitor charging, the subsequent oscillator burst is well within detection range. One therefore has to obtain some minimum voltage across the input to the rectifier. Presently rectifiers require on the order of 100 millivolts at the antenna input, but in the subject invention there are two approaches to overcoming charging range limitations associated with the 100-millivolt threshold.

The first approach is to couple the microradio to a naturally radiating structure such as a metal object, or a dielectric material having some conductivity. A living organism can provide such dielectric material because of its salt content. Coupling to a radiating structure in this manner increases the effective antenna gain of the microradio, thereby increasing the voltage level at the antenna input.

If, for instance, one wishes to keep track of metallic objects, one can connect the antenna inputs of the microradios to the metallic skin of an object, which serves as a naturally radiating structure. It has been found experimentally in one case that if one seeks to use a micro-antenna about the size of the microradio one can obtain a −4 dB of gain, even though the microradio is a thousandth of a wavelength. It is known from the G=4 pi A/lambda^2, that antenna gain is related to antenna area A. Given that the microradio antenna is so small, it is clear that the microradio has coupled into the metallic object in this case. Otherwise, the antenna gain would be about 4 pi(1/1000)^2 using the above equation with an antenna area equal to (lambda/1000)^2.

An additional approach to increasing the detection range of the microradios is accomplished through coherent operation of a large number of microradios n, which results in an amplification of the transmitted signal power by $n^2$ due to coherent combination of the electromagnetic fields generated by each microradio transmitter. Moreover, the opportunity to increase gain is afforded when one uses microradios on an object such as a metallic shell in such a way that the object to which the microradio functions as an antenna.

Other examples of naturally radiating structures are various parts of vehicles. For instance, if one wants to track a car one can put a microradio on the feed to the car antenna. However, attempting to place a microradio at the feedpoint of an antenna results in many misadventures and proper placement is a rare occurrence. On the other hand, with large numbers of microradios dispersed on a metallic auto part in a suitable paint or other coating in which microradios are suspended or otherwise emplaced or entrained, if the part can function as an antenna then microradio placement is not critical because some of the microradios will be located at an antenna feedpoint or feedpoints.

For instance, one can consider something like a car door that makes a slot antenna or perhaps even the bumper of a car that makes a horizontal monopole antenna. Applying a suitable paint or other coating containing microradios to these surfaces naturally results in some microradios being optimally placed.

As will be appreciated, there are a large number of instances where an indigenous material or object can function as an antenna.

A second approach to more effectively charging the rectifier is to use pulsed charging waveforms. Due to the exponential forward conduction properties of diodes described elsewhere, increasing the input voltage to the rectifier diodes exponentially increases charge current to the capacitor. Therefore, pulsed operation of the charging transmitter generates more current into the capacitor than does steady state operation for the same average power level.

An additional approach to increasing the detection range of the microradios is accomplished through coherent operation of a large number of microradios n, which results in an amplification of the transmitted signal power by $n^2$ due to coherent combination of the electromagnetic fields generated by each microradio transmitter. Moreover, the opportunity to increase gain is afforded when one uses microradios on an object such as a metallic shell in such a way that the object to which the microradio functions as an antenna.

Naturally Radiative Structures

As illustrated in FIG. 1, the power for the microradio is derived from a structure 10 that in one embodiment is a naturally radiating structure. Here it can be seen that the output 40 of oscillator 18 is coupled directly to this structure as illustrated at 42.

Note, the substrate over which the microradios are dispersed, if it can function as an antenna, results in much improved parasitic coupling. The disadvantage is that one has to study the geometry of the object one is tagging in order to know where the opportune tagging spot is. Thus, placing a microradio on an object to obtain suitable gain is not always an easy matter. However, by mass-producing thousands of the particle-size microradios, when sprayed on an object one has an ensemble of returns from all the different microradios, some of which will be at naturally occurring feedpoints, thus to create enough energy to power the microradios.

Naturally occurring radiative structures can include metal structures with slits or slots in them, or metal structures that have an appropriate antenna length. Moreover, a naturally radiative structure can include animal tissue, which because of its salt content provides sufficient conductivity.

Thus, when a specialized antenna is not provided for each microradio, as one part of the subject invention one utilizes natural radiative structures.

Specialized Antennas

Figure 2:
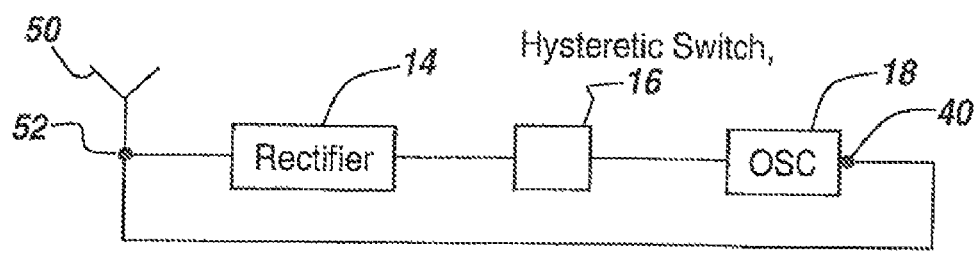
FIG. 2 is a block diagram illustrating the microradio of FIG. 1, rather than coupled to a naturally radiative structure, coupled to an antenna for improvement of the parasitic powering and the range of the microradio.

On the other hand and as illustrated in FIG. 2, output 40 can be connected to an antenna 50 at antenna feedpoint 52. The use of an antenna improves charging and transmission characteristics of the microradio of FIG. 1 due to the gain of the antenna.

One approach to overcoming diode thresholds is to provide the microradio with this specialized antenna. Rather than attempting to locate a microradio precisely at the feedpoint of an antenna or depending on random distribution, one can power the microradios utilizing the parasitic paradigm by providing a small standalone antenna coupled to the microradio. When one cannot ensure that the structure on which the microradios are adhered will function appropriately as an antenna, one can provide each microradio with its own antenna.

It is within the scope of the subject invention to utilize any of a number of small dipole antennas that would be invisible or unobtrusive.

The antennas serve two purposes. First, the antenna receives ambient RF energy or laser radiation in order to charge the capacitor on the microradio. Second, the antenna radiates an electromagnetic signal when the microradio responds with a burst of transmitted information.

In one embodiment it has been found that it is possible to be able to efficiently couple energy into the microradios utilizing a dipole antenna constructed from filamentary wires. One can also make the small standalone antenna using microcoils. One can typically achieve effective gain numbers in the range of −40 or −30 dBi looking at these antennas as free-space antennas. Loading the antennas with high-dielectric or high permeability materials will improve antenna gain beyond these values.

Moreover, a magnetic dipole antenna can be formed in which the loop has a number of microturns. In one embodiment this can be a microcoil staircase with 10 to 20 turns on it. It is noted that the higher the magnetic permeability value µ of the material inside the coil, the higher the gain.

As will be discussed, the antennas themselves can be fractions of a wavelength such that their size matches the 10-micron size of the smallest of the microradios. It has thus been found that such antennas can be dipoles, coiled antennas, monopoles or other small antennas. In many cases using high permeability materials such as ferromagnetic materials or high dielectric materials such as barium titanate can improve the microantenna efficiency.

Figure 3:
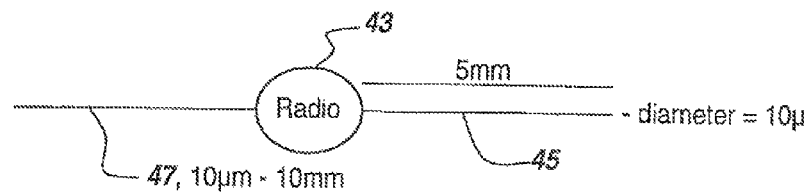
FIG. 3 is a diagrammatic illustration of a miniaturized dipole coupled to the microradio of FIG. 1 or 2, showing that the length of the portions of the dipole are commensurate with the size of the microradio.

More particularly, as illustrated in FIG. 3 it is possible to provide a microradio 43, 10 microns-10 millimeters, with a dipole antenna having a tadpole-like design with a 5-millimeter wire 45 extending in one direction and optionally with another 5-millimeter wire 47 extending in a different direction. It is noted that the overall length of these antennas is less than 10 millimeters and one could question their gain or efficiency at the frequencies involved.

However, it has been found that the dipole wires need not be elongated as dictated by the operating frequency or even stretched out, but can be made to conform to a compact shape such that one could maintain the relatively small size of the microradio and antenna combination.

The manufacture of such antennas along with the microradios in a highly dense, repeatable semiconductor process will be described hereinafter. However, if the microradios are manufactured with their own dedicated dipole antennas, then the gain of the system can be maximized.

Figure 4:
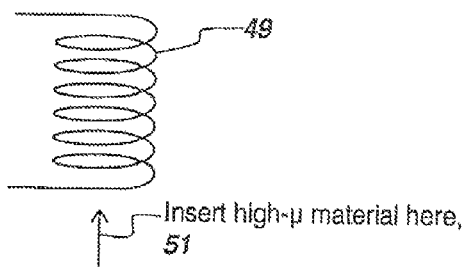
FIG. 4 is a diagrammatic illustration of a microcoil antenna for use with the microradio of FIG. 2.

Referring to FIG. 4, rather than utilizing the dipoles of FIG. 3, a microcoil can be used as an antenna in which a coil 49 may be provided with a high-µ material 51 inserted for the purpose of causing the microcoil to resonate at a desirable frequency without having to have an increased diameter. The result is that a microcoil antenna may be provided with a 0 to 3 dBi gain at f=2 GHz. It is noted that the higher the µ of the inserted material, the higher the efficiency of the antenna.

Figure 5:
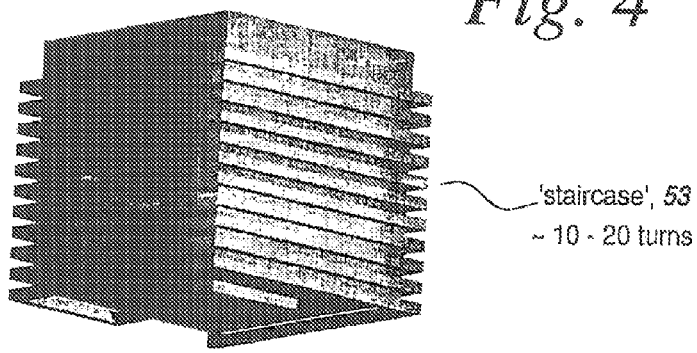
FIG. 5 is a diagrammatic illustration of a staircase antenna having a number of turns about a high-µ core to provide a low profile antenna for use in the microradio of FIG. 2.

Referring to FIG. 5, one can provide a microcoil antenna in a staircase version as illustrated at 53, with 10 to 20 turns configured as illustrated.

The staircase is fabricated by successively depositing conducting and insulating layers using a semiconductor fabrication process. For example, the insulating layer can be a standard silicon oxide layer while the conducting layer can be any deposited metallic material.

The purpose of the staircase antenna is to provide a coil antenna geometry that is compatible with microelectronic fabrication techniques, resulting in an efficient miniature magnetic dipole antenna.

Charging/Transmit Cycle

Referring back to FIG. 1, assuming that there is enough power to overcome the thresholds of the diodes in rectifier 14, in one embodiment there is a charging/transmit cycle protocol that involves the rectifier being charged for, for instance, one to two seconds, whereupon the rectifier is coupled to oscillator 18 to power the oscillator to provide, for instance, a millisecond burst. Thus it is possible with such a regime to utilize relatively inefficient microradios and to be able to provide enough energy to power the oscillator and attendant circuitry for a burst of information.

If the oscillator is to cyclically broadcast its information, then it simply does so when powered. If, however, in a charge, listen, charge, transmit cycle the microradio must wait for receipt of an activating or control signal. Then when the charging threshold is met, the microradio's receiver is briefly turned on. If there is an activation signal received during this listening period, the capacitor is recharged over a long cycle followed by activation of the oscillator to produce a microburst. Note that external activation can occur by irradiating the microradio with a laser pulse, or by an RF control signal.

Regardless of the external activation of the oscillator, it is the purpose of the hysteretic switch 16 to allow the final capacitor within rectifier 14 to charge up for a relatively long period of time before hysteretic switch 16 goes into conduction and passes the power from this capacitor to oscillator 18. The result is a powering cycle, as illustrated at waveform 24, that causes the capacitor to charge up to a threshold point 26, at which the capacitor is rapidly discharged as illustrated at 48 through oscillator 18.

The result is that the charging interval, as indicated by arrow 30, is much longer than the transmit interval illustrated by double-ended arrow 32.

Timeline

Figure 6A:
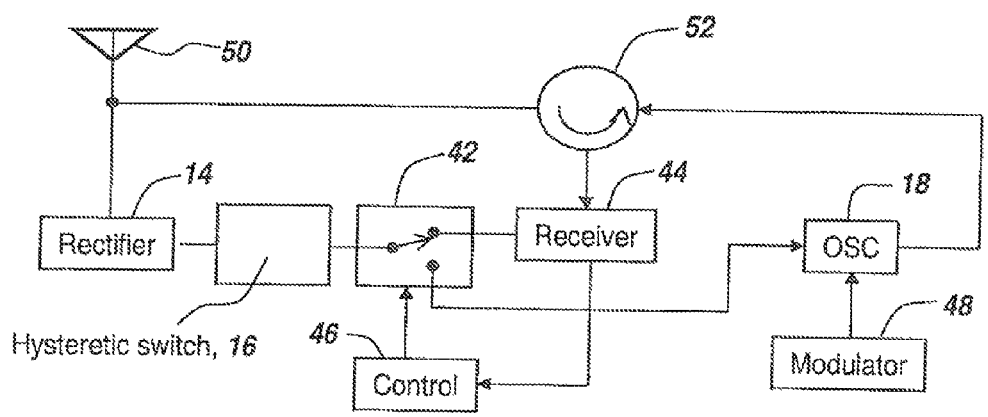
FIG. 6A is a block diagram of a microradio that includes both a modulated oscillator and a receiver section detecting command signals and for causing power to be applied to the oscillator after receipt of a command signal.
Figure 6B:
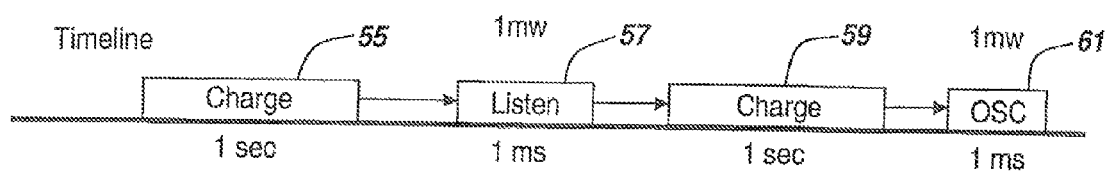
FIG. 6B is a graph showing the timeline for use in parasitically powering the microradio of FIGS. 1 and 2, indicating a relatively long charge time of about 1 second to impart about 1 microjoule to the receiver of the microradio, which listens for approximately 1 millisecond and dissipates one milliwatt, followed by a second 1-second charging interval, followed by powering the oscillator of the microradio, again for 1 millisecond, whereby the hysteretic switch operation of the microradio permits relatively slow parasitic charging followed by a burst of energy either to permit the microradio to listen to command signals or to fire off the oscillator of the microradio.

Central, however, to the ability to provide the microradios with the ability to transmit over significant distances is the powering cycle timeline and the micro-receiver elements shown in FIGS. 6A and 6B.

Referring now to FIG. 6A, assuming for instance that one has a rectifier 14, hysteretic switch 16 and an oscillator 18, this scenario would be useful when one did not wish to have control signals to operate or activate a microradio. However, if one wishes to have a control signal scenario, one needs to have the output of hysteretic switch 16 coupled through a single-pole double-throw switch 42 to, in the first instance, establish a listening time period, which is established by powering receiver 44. Upon the powering of receiver 44, the receiver is coupled to antenna 50 by virtue of circulator 52.

Upon receipt of command signals, receiver 44 is operably coupled to control 46 to switch 42 to switch power to oscillator 18 so as to activate oscillator 18 to provide a signal back through circulator 52 to antenna 50. Oscillator 18 may be modulated by a modulator 48 for providing whatever information is required to be transmitted at this point, given the receipt of control signals for the microradio to do so.

Referring to FIG. 6B, here it can be seen that the timeline includes a charging period 55, which may be on the order of a second and which allows a final capacitor in rectifier 14 to be charged, for instance, to 1 microjoule. Thereafter, as illustrated at 57, there is a listening portion of the timeline that may offer a short 1-microsecond to perhaps one millisecond listening time slot. The command receiver consumes approximately one milliwatt of power to power the microradio's receiver for the listening operation. The command period enables reader authentication and timing synchronization with the microradio.

Thereafter, there is another one-second charging interval, here illustrated at 59, followed by a short period 61 of approximately one millisecond duration for the oscillator to generate a one-milliwatt burst.

Thus one embodiment of the subject invention includes developing an optimal charging/transmit cycle timeline in which one charges the final capacitor, for instance, for one second, after which one would listen for command signals during one millisecond, again charging the capacitor for one second and then powering the oscillator for one millisecond.

By use of this cycling one can charge the capacitor from the parasitic coupling for relatively long periods of time, whereupon the device can listen for instructions from the outside world and emit a short burst, followed by another charging period, and another burst. This charging regime is very effective for parasitically powered microradios and is available for any microradio application.

Hysteretic Switch

Figure 7:
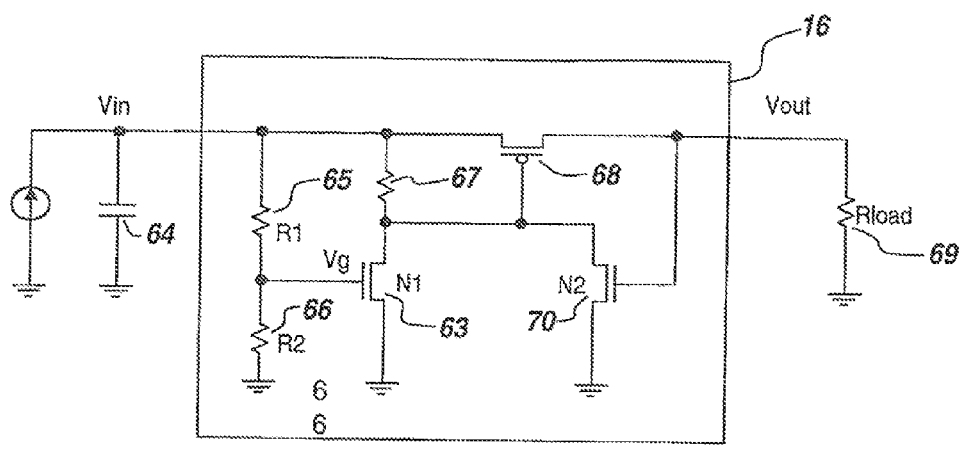
FIG. 7 is a schematic diagram of the hysteretic switch used in the microradio of FIGS. 1 and 2, illustrating the firing of the switch based on the gate voltage to one field effect transistor, coupled with a second field effect transistor holding on the switch until the voltage across the charging capacitor drops below a predetermined level.

Referring now to FIG. 7, a hysteretic switch in one embodiment includes two CMOS FET transistors in which a transistor 63, here labeled N1, senses the voltage at capacitor 64 by having its gate coupled to a voltage divider coupled between the capacitor and ground as shown by resistors 65 and 66. Note that a pull-up resistor 67 is provided. Note that when the gate voltage $V_g$ of transistor 63 is greater than $V_{thn}$, then the gate of PFET transistor 68 is such that transistor 68 connects capacitor 64 to a load 69, which in this case is oscillator 18 of FIGS. 1, 2 and 3. An FET transistor 70 keeps transistor 68 in its conducting region to hold it on until capacitor 64 discharges below the useful supply voltage level to the oscillator load 69.

In one embodiment it is the goal of the hysteretic switch to switch on when the input voltage is greater than, for instance, 1.5 volts. Note, it is desired that the rectified power provide up to 2 volts across the output capacitor, which in one embodiment is a 2 microfarad capacitor.

When the storage capacitor is being charged up, the hysteretic switch is open. When the threshold or trip point is exceeded, the hysteretic switch connects the capacitor to the load, in this case the oscillator. The load then draws current from the capacitor and begins to discharge it. In one embodiment, when the capacitor voltage drops below the threshold voltage, the hysteretic switch stays on. When the capacitor voltage drops below 1 volt, the switch disconnects the load from the capacitor, the capacitor starts to charge up, and the cycle repeats.

Referring now to FIG. 7, a hysteretic switch in one embodiment includes two CMOS FET transistors in which a transistor 63, here labeled N1, senses the voltage at capacitor 64 by having its gate coupled to a voltage divider coupled between the capacitor and ground as shown by resistors 65 and 66. Note that a pull-up resistor 67 is provided. An FET transistor 68 connects capacitor 64 to a load 69, which in this case is oscillator 18 of FIGS. 1, 2 and 3. An FET transistor 70 keeps transistor 68 in its conducting region to hold it on after a capacitor voltage threshold is reached. Note that when the gate voltage $V_g$ is greater than $V_{thn}$, then capacitor 64 is dumped to load 69.

In one embodiment it is the goal of the hysteretic switch to switch on when the input voltage is greater than, for instance, 1.5 volts. Note, it is desired that the rectified power provide up to 2 volts across the output capacitor, which in one embodiment is a 2 microfarad capacitor.

When the storage capacitor is being charged up, the hysteretic switch is open. When the threshold or trip point is exceeded, the hysteretic switch connects the capacitor to the load, in this case the oscillator. The load then draws current from the capacitor and begins to discharge it. In one embodiment, when the capacitor voltage drops below 1 volt, the hysteretic switch turns off and the cycle repeats.

Note in the circuit of FIG. 7, transistor 68 is a PFET, with pull-up resistor 67 keeping this transistor off while the capacitor charges up. Transistor 63 is an NFET that senses when the capacitor voltage is high enough. Resistors 65 and 66 form a voltage divider that feeds the gate of NFET 63, which selects the trip point. Note the resistors must be of high resistance so that the capacitor is not drained faster than it is being charged.

Transistor 70 is also an NFET that holds switch 68 on as capacitor 64 discharges and provides the subject hysteresis. It is noted that transistor 68 will not switch off until the load voltage drops below transistor 70's threshold voltage, which in one embodiment is approximately 0.5 volts.

While the circuit of FIG. 7 functions properly, the sub-threshold leakage current in transistor 63 can in some instances keep capacitor 64 from charging up to 1.5 volts. In order to solve this problem one must keep the leakage current well below one micro-amp until the capacitor 64 voltage is above 1.5 volts.

To minimize the sub-threshold leakage problem, there are several circuit designs, one of which is suggested by E. Vittoz et al. in the following IEEE Journal article: Vittoz, E.; Fellrath, J., "CMOS analog integrated circuits based on weak inversion operations," *Solid-State Circuits, IEEE Journal of*, Vol. 12, no. 3 pp. 224-231, June 1977. Additionally, it is possible to utilize bipolar transistors as can be seen in the 1965 IEEE article by Gaertner, W W., entitled "Nanowatt devices," *Proceedings of the IEEE*, vol. 53, No. 6, pp. 592-604, June 1965. A further solution is to utilize an auxiliary capacitor isolated from capacitor 64 that is driven by the same source and which powers the hysteretic switch control circuit. Moreover, one can deliberately bias all FETs to operate at nano-amp levels where the functions provided by the circuit can operate with Idd's below 1 micro-amp.

It is a feature of the subject invention due to the charging regimes discussed above that the storage capacitor, while preferably a supercapacitor, need not be one. The reason in the past for super storage capacitors was to be able to store enough power in a small enough physical capacitor to be able to power the traditional RFID tag-type radios.

However, with the use of the hysteretic switch it has been found that storage on more conventional capacitors, even though resulting in a crude microradio, nonetheless provides sufficient output.

Thus a charging regime that uses a hysteretic switch and takes place over multiple seconds or minutes compared to a microburst from an oscillator permits smaller, less dense storage capacitors to be used.

It is this type of regime that enables relatively crude transceivers to develop enough power to extend range. This is unlike an RFID tag, whose power is derived parasitically but which is used immediately so as to function as a smart reflector.

In order to achieve the charging/transmit cycle, the hysteretic switch's function is to keep the final capacitor of the rectifier from leaking towards the oscillator such that power is allowed to build up in the final capacitor of the rectifier for later dumping into the oscillator.

While several types of hysteretic switches are possible, the simplest, of course, is to provide a transistor coupled to the final capacitor and to bias the transistor in such a way, either naturally or with circuit elements, so that it goes into conduction only after a predetermined charge has built up on the final capacitor. Thereafter it remains in conduction until the oscillator has drained a sufficient amount of voltage from the capacitor and the capacitor voltage output drops below the point at which conduction is no longer sustainable.

Dual Frequency Operation

Figure 8:
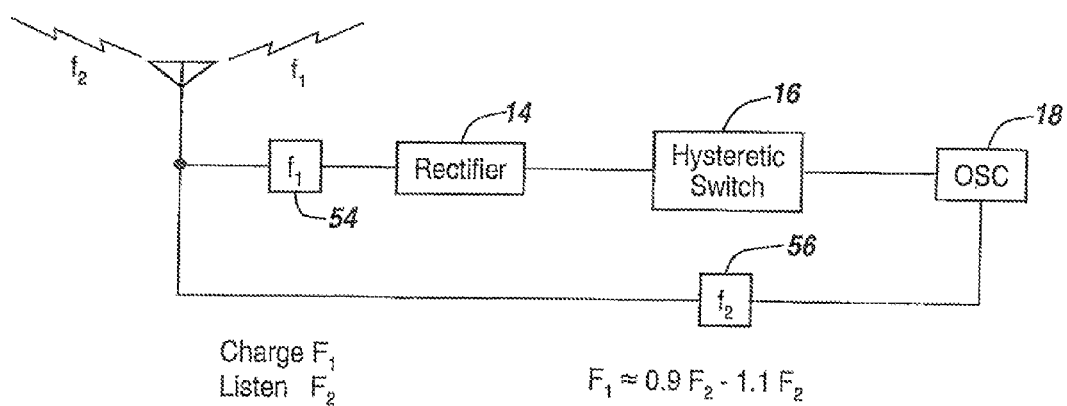
FIG. 8 is a diagrammatic illustration of a dual frequency operation of the microradio in which energy is parasitically coupled to the microradio at one frequency, whereas the microradio transmits at another frequency, both utilizing the same antenna.

Referring to FIG. 8, it is possible to charge rectifier 14 by irradiating antenna 50 with energy having a frequency $f_1$, with the rectifier having a filter 54 at $f_1$ interposed between feedpoint 52 and the rectifier. In one embodiment, oscillator 18 may be made to oscillate at a different frequency, namely frequency $f_2$, as illustrated by filter 56, such that the oscillator transmits electromagnetic radiation at a different frequency than the energy, is received in order to charge up the final capacitor of rectifier 14. One reason for doing this is to increase the efficiency or range of the microradio by avoiding leaking the transmitted energy back into rectifier 14.

Another reason for providing the two-frequency system is to simplify the design of the microradio detector, or reader. Specifying different frequencies for charging and transmission allows for a less complex microradio reader receiver design. This is because if the charging and transmit signals are on the same frequency, they will interfere. Isolation and cosite interference cancellation would required to separate the strong cochannel charging signal being transmitted by the reader from the much weaker signal returned by the microradio.

It has been found that if $f_1$ is offset by between 0.9 $f_2$- to 1.1 $f_2$, these frequencies are sufficiently different to derive the above benefits.

Thus, for more efficient capacitor charging, in one embodiment charging current is provided by charging with RF energy at one frequency, whereas the information derived from the radios is derived by listening to an adjacent frequency. In one embodiment, for instance, the charging frequency is approximately from 0.9 to 1.1 of the listening frequency.

Multiple-Frequency Charging

Figure 9:
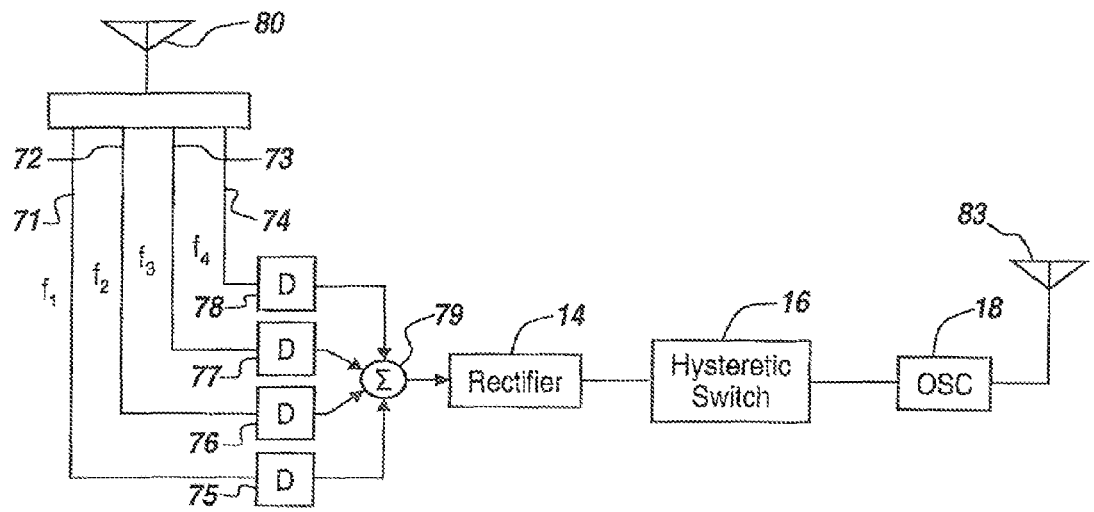
FIG. 9 is a block diagram of a multi-frequency charging system for the microradios of FIGS. 1 and 2, illustrating different antenna paths tuned to different frequencies utilizing different diode detectors, the outputs of which are summed and rectified to provide improved parasitic charging of the final capacitor of the rectifier in the microradio.

Referring now to FIG. 9, it has also been found that the microradio can be more efficiently charged by providing, for instance, an array of antenna outputs 71, 72, 73 and 74 outputted to an antenna 80 and each tuned to a different frequency, here shown as $f_1$, $f_2$, $f_3$ and $f_4$. These can be provided with corresponding delay elements, 75, 76, 77 and 78, the outputs of which are summed at 79.

The result at rectifier 14 in terms of the charging of the final capacitor thereof is that a tag reader that is limited in peak transmit power can sequence between a multiplicity of transmitted charging frequencies. The frequency sequence and the delays are arranged so that the power transmitted at each frequency arrives simultaneously at the summer input. This technique takes a continuous wave charging signal and groups it into a set of pulsed inputs to the rectifier. The reason for doing so is that diodes are exponentially inefficient devices. That is, the conduction current through the rectifier diodes drops exponentially with respect to input voltage. By pulsing the charging inputs, the diodes operate in a more efficient conduction regime. Even though the net duty cycle is less than for a continuous charging input, the smaller total charging time is more than compensated by more efficient diode conduction during the higher energy pulsed inputs. The resultant output of oscillator 18 is applied to a transmit antenna 83 in the manner previously described.

Thus in one embodiment, it is possible to rectify different frequencies of RF radiation through different antenna outputs. This means that with multiple frequencies irradiating the ensemble of microradios, the amount of power to the diodes in the rectifier is increased, thus to exceed diode thresholds and to improve diode conduction efficiency.

Voltage Multiplier

Figure 10:
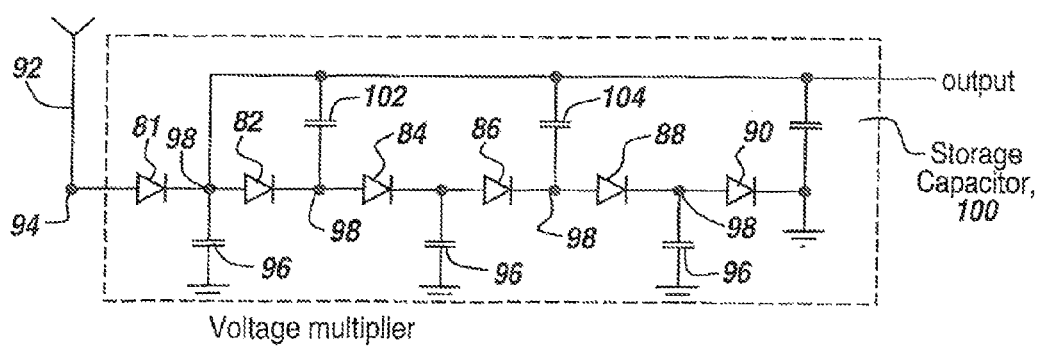
FIG. 10 is a schematic diagram of a voltage multiplier usable as the rectifier in the microradios of FIGS. 1 and 2, illustrating voltage multiplier stages, each having its own capacitor, coupled to a final storage capacitor for the rectifier in which the voltage multiplier rectifier may be either coupled, to the environment through a naturally radiative structure or to an antenna.

Referring now to FIG. 10, in one embodiment rectifier 14 is a voltage multiplier incorporating diodes 81, 82, 84, 86, 88 and 90 coupled in series to antenna 92, feedpoint 94.

Each stage of the voltage multiplication includes a capacitor 96 to ground between the output of a previous diode and the next diode such as indicated at points 98. The output of diode 90 is directly coupled to final storage capacitor 100, where capacitors 102 and 104 accumulate respectively the outputs of diodes 82 and 86 such that the charges on capacitors 102 and 104 are applied across storage capacitor 100 and ground. The operation of voltage multipliers is well known, and all result in a charge on a final storage capacitor.

Modulation for the Microradio

Figure 11A:
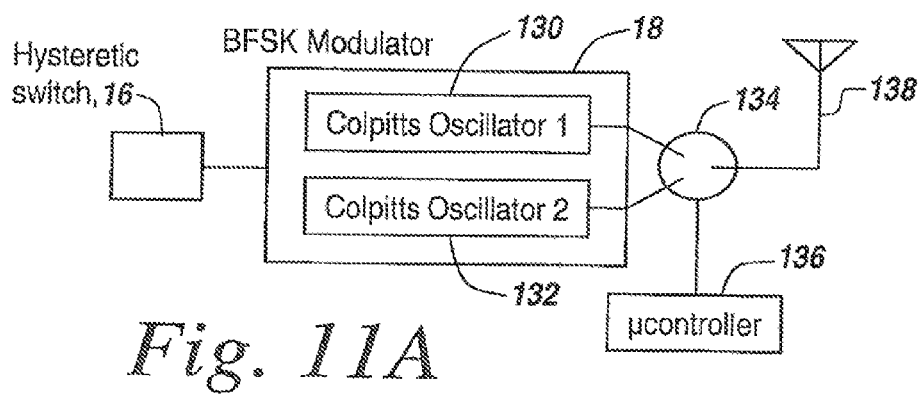
FIG. 11A is a block diagram of a Colpitts oscillator used in the BFSK modulation of a microradio, showing the switching between the outputs of two Colpitts oscillators under the control of a microcontroller for modulation purposes.

Referring now to FIG. 11A, one of the most easily implemented modulation schemes takes oscillator 18 and divides it up into two Colpitts oscillators, namely oscillators 130 and 132, each operating at a different frequency. With such a scheme one can control the outputs of oscillators 130 and 132 via a switch 134 under the control of a microcontroller 136 to provide a BFSK modulation scheme in which the output of switch 134 is coupled to an antenna 138 or coupled to the environment through a naturally radiating structure.

Figure 11B:
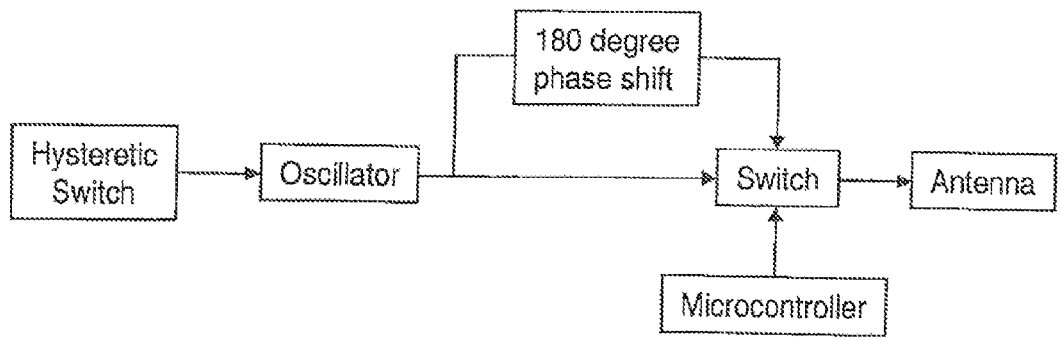
FIG. 11B is a block diagram of a BPSK modulator, including a microprocessor for controlling the outputs to an antenna.

Alternatively, as illustrated in FIG. 11B, one can have a BPSK modulator in accordance with the Taub and Schilling design shown there.

In this embodiment, an oscillator 140 opened up by a hysteretic switch 142 generates a sinusoidal output. One pathway for the output goes straight to a switch 144. The other goes through a 180-degree phase shifter 146. A microcontroller 148 controls the switch to select which output couples to an antenna 150 or a naturally radiating structure. What will be appreciated is that whatever modulation scheme is used for the microradio, information can be transmitted from one or more of the microradios in accordance with sensed data or simply in accordance with a registration code so that one could identify the individual microradio providing the transmission. This is quite similar to RFID tag-type of registrations that, as will be seen, can be manufactured directly into the microradio at the time of manufacture.

Moreover, modulation of the radio may be accomplished by using two Colpitts oscillators, one resonating at one frequency and another at a different frequency, thus to provide the mark and spaces to be transmitted by the microradio. For this purpose one could also use a Taub and Schilling BPSK modulator.

For the purpose of this invention, a "Colpitts oscillator" will be considered to be a radio frequency (RF) oscillator that uses a single, untapped inductor with a combination of two fixed capacitors in series connected in parallel with the inductor. A "Binary Frequency Shift Keyed (BFSK) modulator" is a modulator comprised of two distinct oscillators and a switch selecting between the oscillators depending upon whether the data bit is a mark or a space. A "Taub and Schilling Binary Phase Shift Keyed (BPSK) modulator" is a modulator which has an oscillator, a direct path to a switch, and a 180° phase shift path to a switch, wherein the switch selects between the two paths depending upon whether the data bit is a mark or a space.

As will be seen, the ability to provide a modulated signal from such a microradio permits a wide variety of applications described above.

Nanoradio Implementation

Figure 12:
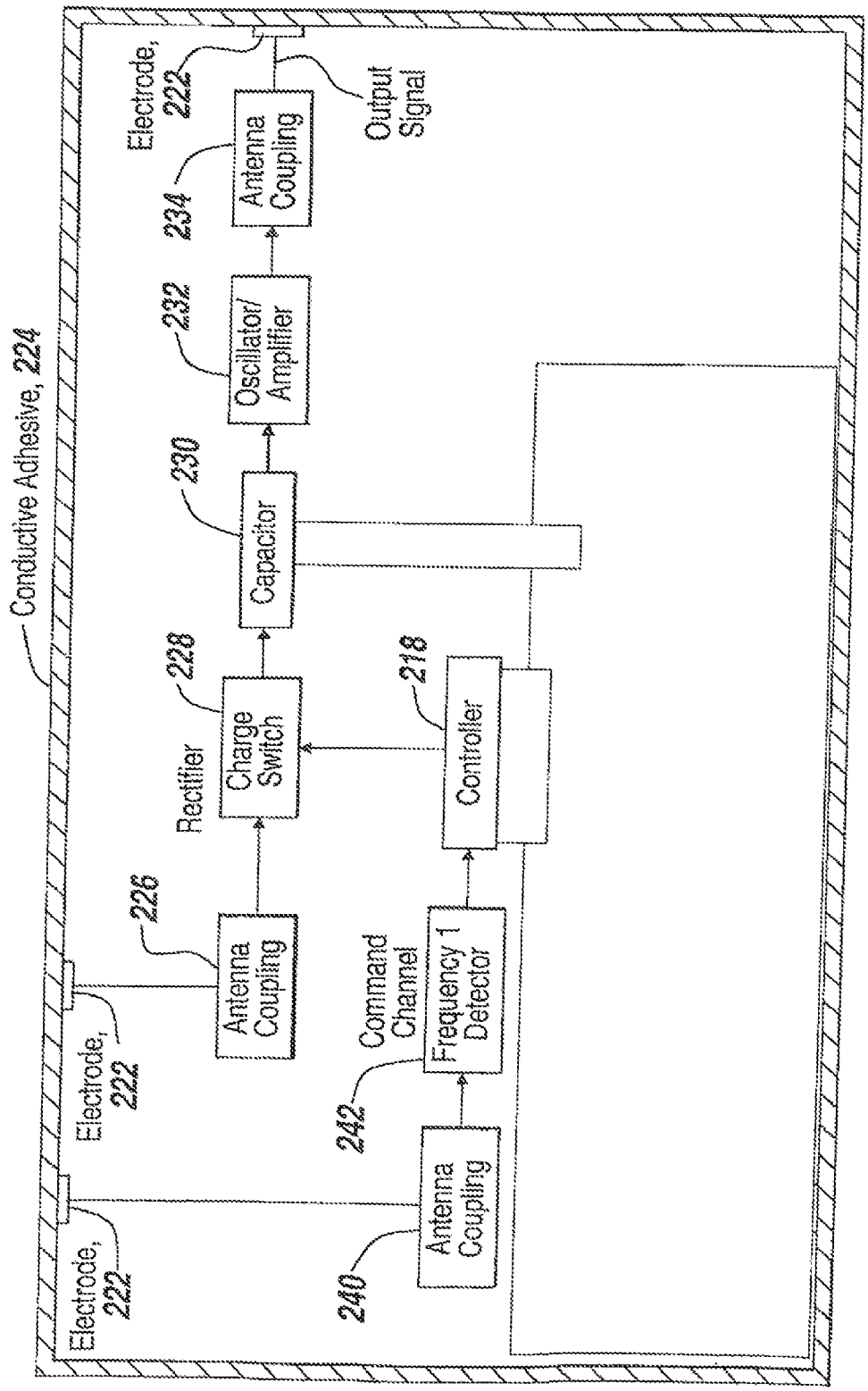
FIG. 12 is a diagrammatic representation of an invisible or nearly invisible microradio using molecular components for use in attaching to or coating the antenna used.

More particularly and referring now to FIG. 12, a microradio is shown utilizing nano-electronic components. Here microradio 210 is comprised of electrodes 222 which connect the circuits within a module to a conductive adhesive coating 224 which when deployed to an antenna connects the internal circuits of the module to the antenna.

In cases where a protective coating prevents direct conductive coupling with the target antenna, electrical coupling is possible using capacitive, inductive or radiative techniques, usually at the cost of greater insertion loss and consequent higher stored energy requirements.

For this purpose an antenna coupling 226 is utilized to couple the radiated energy from the antenna to a rectifying circuit 228 which may be a nanotube rectifier incorporating a single electron transistor. The output of the rectifying circuit is coupled to a capacitor 230 which is constructed from thin plates as are used to fabricate nano-electrodes, with the capacitor in turn coupled to an oscillator/amplifier 232. The capacitor includes a switch that closes upon receipt of a command signal in order to activate the oscillator. Oscillator/amplifier 232 may include a nanowire resonant tunnel diode or a transistor for RF purposes, or a high efficiency quantum dot LED or a small laser, for example, a quantum cascade laser for infrared purposes. In the illustrated embodiment, the output of the oscillator/amplifier is delivered to an antenna coupler 234 that is connected to electrode 222 to couple out the signal available at the output to the conductive adhesive coating 224.

The device thus formed is a parasitic device that derives its power from rectifying the RF energy at the surface of an antenna. In the IR case, the rectifying circuit may also be utilized to rectify optical energy to charge capacitor 230, or it may rectify radio frequency energy from a nearby radio transmitter used for communications or radar.

The second part of the microradio includes a command channel which is to receive signals to activate the radio and for this purpose an antenna coupler 240, which may include nano-electrodes or nanowires, and couples signals from a conductive adhesive 224 to a command channel frequency detector 242 which is in turn coupled to controller 218. Controller 218, upon receipt of an authorizing signal, activates a switch signal 228 to discharge the capacitor 230 to power oscillator 232, thereby to generate the signal. This signal is applied through antenna coupling 234 to electrode 222 and thus to conductive adhesive layer 224, which in turn directly couples the output of the oscillator/amplifier to the antenna to which it is connected.

It will be noted that command channel detector 242 may be implemented as a frequency detector. This implementation is especially compatible with designs intended to minimize parts by using common apertures for command reception and for monitoring other transmitters.

Figure 13:
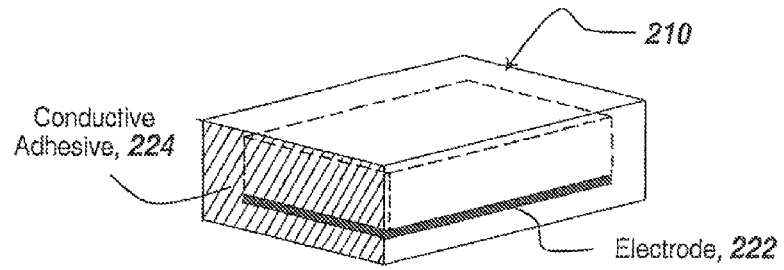
FIG. 13 is a diagrammatic representation of the invisible or nearly invisible microradio of FIG. 12 showing the use of a conductive adhesive about the module so that it will stick to an antenna surface and provide electrical contact thereto.

Referring to FIG. 13, each of the microradios 210 is illustrated having the conductive adhesive 224 coupled to an electrode 222 that exists at the base of the module. Thus, the encapsulation of the modules in a conductive material such as a conductive grease renders the module attachable to any surface it contacts and more importantly a surface of an antenna.

If on the other hand an optical system is used, then an optical coupler layer surrounds microradio 210, with the optical coupler layer both parasitically receiving light energy from a target light source and at the same time injecting light energy elsewhere.

As mentioned above, in one embodiment the command receiver consists of an antenna coupling that couples radiation incident on the antenna to frequency detector 242 tuned to the command link frequency, as shown in FIG. 12. The frequency detector is kept to a simple pulse detector in order to facilitate implementation at the nanometer scale. Pulses detected by the frequency detector 242 are output to controller 218, with a simple pulse pattern being provided as a rudimentary command set. As will be appreciated, frequency detectors can conserve command link power if they support spread spectrum modulation.

In operation, switch 228 discharges capacitor 230 driving oscillator/amplifier 232. The generated power is delivered directly into the antenna through coupling 234.

What is now discussed is how nanotechnology can reduce the size of the components in the module shown in FIG. 12 so that the module is invisible to the unaided eye.

Antenna Coupling

Figure 14:
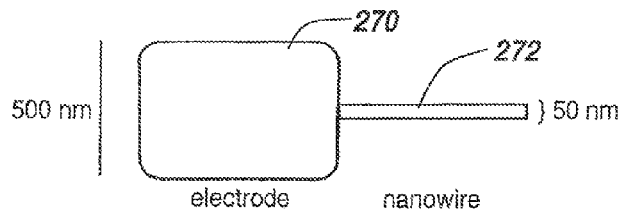
FIG. 14 is a diagrammatic illustration of an electrode and nanowire as well as the size thereof.

Assuming that the microradio shown in FIG. 12 is placed directly on an antenna, a conductor must extend from the device to the radiating surface. Much recent work has been done on developing electrodes with nanowires for electrical conduction. See, for example, Khondaker and Yao. In this reference and as shown in FIG. 14, a pair of 500 nm electrodes fabricated with standard optical lithography are connected to gold nanowires with diameters ranging between 5 nm and 50 nm. These nanowires can be connected to nanoscale devices, providing an interface coupling the microradio to the antenna through the small electrodes and conductive adhesive 224. A chemical agent such as conductive adhesive 224 bonds the electrode to an antenna. In a separate reference, Thong et al. fabricated tungsten nanowires with diameters less than 4 nm. Such an electrode and wire is shown in FIG. 14 by a 500 nm electrode 270 coupled to a 50-nm nanowire 272.

Frequency Detector

Figure 15:
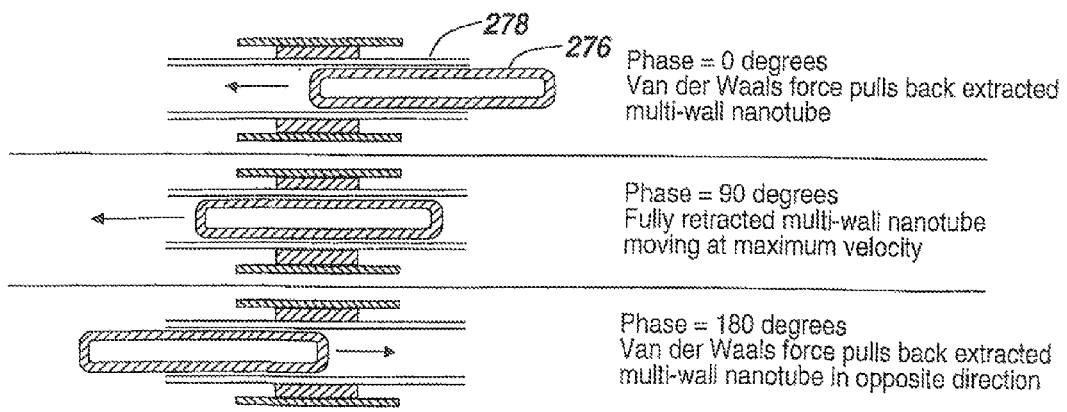
FIG. 15 is a schematic illustration of a multi-wall nanotube oscillation technique.

Nanomechanical resonators are actively developed by many groups including NASA and the Caltech Jet Propulsion Laboratory. As can be seen in FIG. 15, nanotubes 276 formed in multiple concentric tubes 278 tend to oscillate at neargigahertz frequencies. These multi-walled nanotubes are just nanometers in diameter. In 2000, John Cumings and Alex Zettl of the University of California at Berkeley showed that after peeling open one end of a multiwalled tube, the inner tubes 276 could slide in and out with very low friction. The calculations also demonstrated that the van der Waals force, which attracts all neutral atoms to one another through electrostatic attraction due to molecular polarization, caused the inner nanotubes 276 to be pulled back inside the sheath of outer tubes 278. These tubes can be used as receivers sensitive to high frequency electromagnetic signals, resonating in time to the incoming electromagnetic wave.

Figure 16:
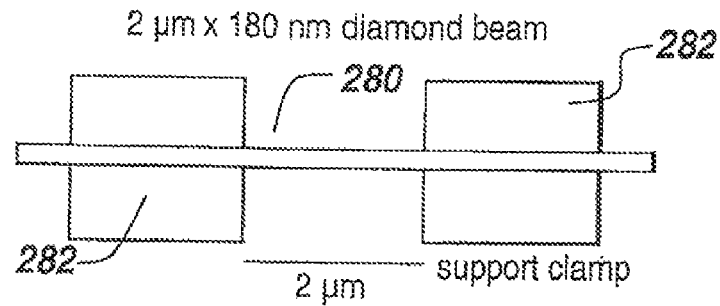
FIG. 16 is a schematic illustration of a doubly clamped diamond beam nonomechanical resonator.

As shown in FIG. 16, while oscillating multi-walled nanotubes remain theoretically attractive, Sekaric et al. at Cornell and NRL recently built and operated a nanomechanical resonant structure in nanocrystalline diamond with a resonant frequency of 640 MHz. The device Q factors were about $Q=f/\Delta f=2400\text{-}3500$. The device size includes a diamond beam 280 supported between two clamps 282 spaced apart by 2 μm.

Charge Switch/Rectifier

Figure 17:
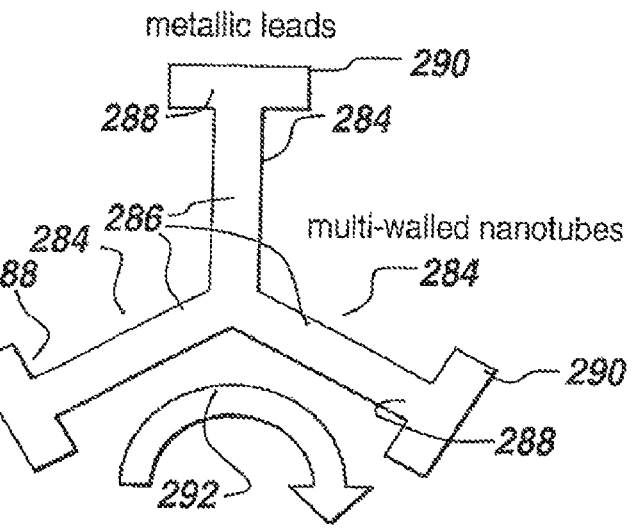
FIG. 17 is a schematic illustration of a three-terminal nanotube rectifier.

One attractive aspect of a microradio is that it can draw power parasitically from a host antenna. No internal power source is required. Power is drawn from the host antenna whenever it transmits by using an antenna coupling feeding into a rectifier that charges a capacitor. As shown in FIG. 17, nanotube rectifiers have been demonstrated experimentally by Papadopoulos et al. Here it can be seen that multiwalled nanotubes 284 are joined together at one end 286, with their other ends 288 coupled to metallic leads 290. Current flow is indicated by arrow 292. Recent calculations by Meunier et al. showed that the one-way current flow observed experimentally is due to the critical role played by the metallic contacts in the rectification process. These authors state that rectification is possible with a suitably constructed two-terminal device.

Switch

Figure 18:
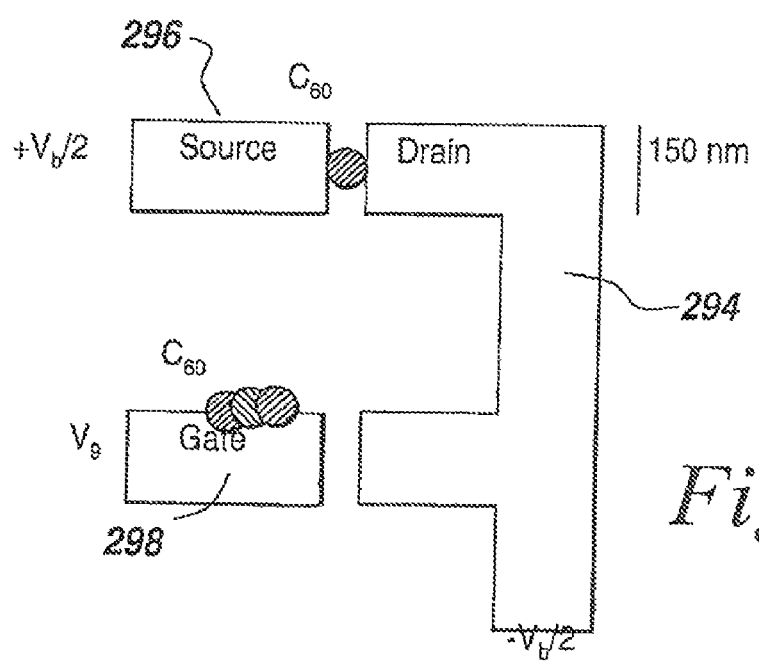
FIG. 18 is a schematic illustration of a single-electron transmitter constructed from gold electrodes and C60 nanoparticles.

Referring to FIG. 18, a transistor switch is provided through a single-electron transistor. Wu et al. have recently fabricated a single-electron transistor that is about 400 nm on a side. Here the transistor is composed of drain 294, source 296 and gate 298, with the biasing as shown. Note that C60 describes a ball-shaped carbon molecular structure known as a fullerene. The single-electron transistor has a great advantage in low power consumption and high packing density. By combining advanced electron-beam lithography and nanophased-material synthesis techniques, Wu et al. built and tested a single-electron device with an gold-colloidal/fullerene island. The gate electrode tunes the potential of the electrode islands.

Capacitor

Figure 19:
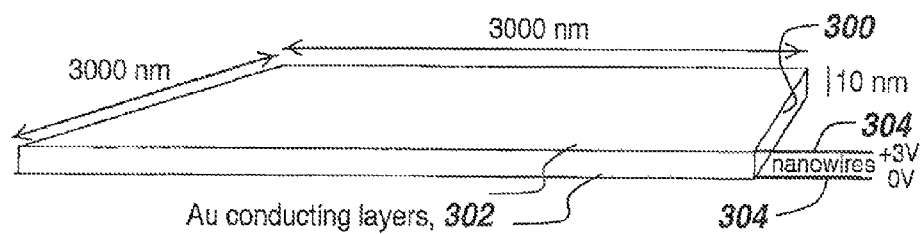
FIG. 19 is a schematic illustration of an energy storage capacitor consisting of two gold plates and a barium titanate dielectric layer.

A capacitor is needed to store energy for the microradio. As illustrated in FIG. 19, using thin film and nanofabrication technology, it is possible to make a very small parallel plate capacitor. Here one has a $BaTiO_3$ layer 300 sandwiched between Au conducting layers 302. Nanowires 304 are connected to layers 302. In one embodiment, the energy requirement is dominated by the need, for instance, to transmit ten microwatts for one millisecond from the microradio tag. As a result, the capacitor must store only 10 nJ of energy. The energy stored in the capacitor is given by $1/2 CV^2$. Assuming that the capacitor can be charged to a few volts, the capacitance of the nanocapacitor must be about 10 nF. The formula for the capacitance of a parallel plate capacitor is $$C = 0.0885 \in_r A/t$$

(van Valkenberg, p 6-14), where C is the capacitance in pF, $\in_r$ is the dielectric constant relative to air, A is the parallel plate area in cm and t is the plate spacing in cm. Using a ferroelectric material like barium titanate ($BaTO_3$), dielectric constants as high as 11,000 is possible. Within a 10 nm $BaTO_3$ layer deposited between two conducting electrode plates, the required area is found from $$10 \times 10^3 = 10^3 A/10^{-6}.$$

Solving for A:

$$A = 10^{-5} \text{ cm}^2.$$

The length of a plate side is therefore $3 \times 10^{-3}$ cm or 30 μm. This dimension could be reduced to 3 μm by stacking one hundred plates or distributing one hundred capacitors over the energy storage component. Note that the capacitor is the largest of the components for the module. Care must be taken to ensure that the BaTiO3 or other material is deposited uniformly so that holes do not develop that will short out the capacitor.

Controller

A device containing logic and memory is necessary to control the various components in the microradio. It could consist of a few logic and memory elements or could be as sophisticated as a microcontroller. Work in this domain is exemplified by the work of Wu et al. One example of a microcontroller may be implemented with single electron transistors and memory cells. Another is nanometer-scale microprocessor development work at Intel (Bohr) and elsewhere (Wong et al.).

The applications targeted by molecular electronics, Moletronics, programs fall into two principal areas, both of which emphasize circuit architecture:

As to logic devices, the design, synthesis, and testing of two interconnected molecular logic gates connected to the outside world produce a correct truth table. The devices operate at room temperature, and the demonstrated configuration is scaleable to densities of greater than $10^{12}$ gates per square centimeter.

As to memory devices, the design, synthesis, and testing of low-power, high-speed circuit architectures for high-density, terabit-level memories is based on molecular electronic devices. The devices have a functional 16-bit molecular memory connected to the outside world at a density of $10^{15}$ bits per cubic centimeter. The molecular memory is capable of performing a storage function at room temperature that is bistable and reversibly driven from one state to the other by an outside signal.

While these microprocessors are difficult to produce, an interim solution uses nanoscale CMOS with devices in the 10-100 nm size regime as described by Wong et al.

Bohr discusses other approaches to logic elements, including carbon nanotube FETs described by Bachtold et al. Bachtold et al. have constructed and demonstrated functioning logic elements including an SRAM memory cell using nanotubes.

Huang et al. built and demonstrated functioning FETs and logic elements using combinations of Si and GaN nanowires. Dimensions are on the order of molecular sizes, with on-off current ratios around $10^5$.

Single-electron transistors have been briefly discussed. Their dimensions are around one nanometer, using quantum dots. Chen et al. numerically simulated a functionally complete set of complementary logic circuits based on capacitively coupled single-electron transistors (CSETs). The family included an inverter/buffer stage, as well as two-input NOR, NAND, and XOR gates, all using similar tunnel junctions, and the same dc bias voltage and logic levels. Maximum operation temperature, switching speed, power consumption, noise tolerances, error rate, and critical parameter margins of the basic gates have been estimated. When combined with the data from a preliminary geometrical analysis, the results indicate that implementation of the CSET logic family for operation at T~20 K will require fabrication of structures with ~2-nm-wide islands separated by ~1-nm-wide tunnel gaps. Getting the device to operate at room temperature requires smaller islands.

It is also possible to build still smaller transistors using quantum-dot cellular automata. Orlov et al. built a micronscale device that is theoretically predicted to work at room temperature if scaled down to a nanometer.

Finally, others are exploring single-molecule transistors. See, for example, Reed. In addition to the extreme degree of miniaturization, a benefit to molecular-scale electronics is the capability for self-assembly through chemical synthesis.

Trigger

The trigger contains elements that have already been discussed. Some logic, memory and switching are needed to arm the trigger, monitor receiver output lines, possibly operate a timer and to switch on the microradio.

Oscillator and Amplifier

An oscillator and transmitter are needed to drive electrical current from the microradio into its antenna. One approach is to use a nanomechanical resonator in a resonant tank circuit. The electrical output is amplified through a carbon nanotube FET, nanowire FET or some other small structure capable of coupling to the oscillator. This device is in turn amplified by a small CMOS FET or other device capable of delivering about 1 µW output power to the coupled antenna. This 1 µW output power is found by calculating the minimum power needed to receive microradio transmissions at distances comparable to feasible tag charging distances.

Another approach is to use a nanowire resonant tunnel diodes. Björk et al. fabricated a nanowire resonant tunneling diode from semiconductor nanowhiskers. Device size is about 40-50 nm diameter whiskers on a $SiO_2$-capped silicon wafer.

Figure 20:
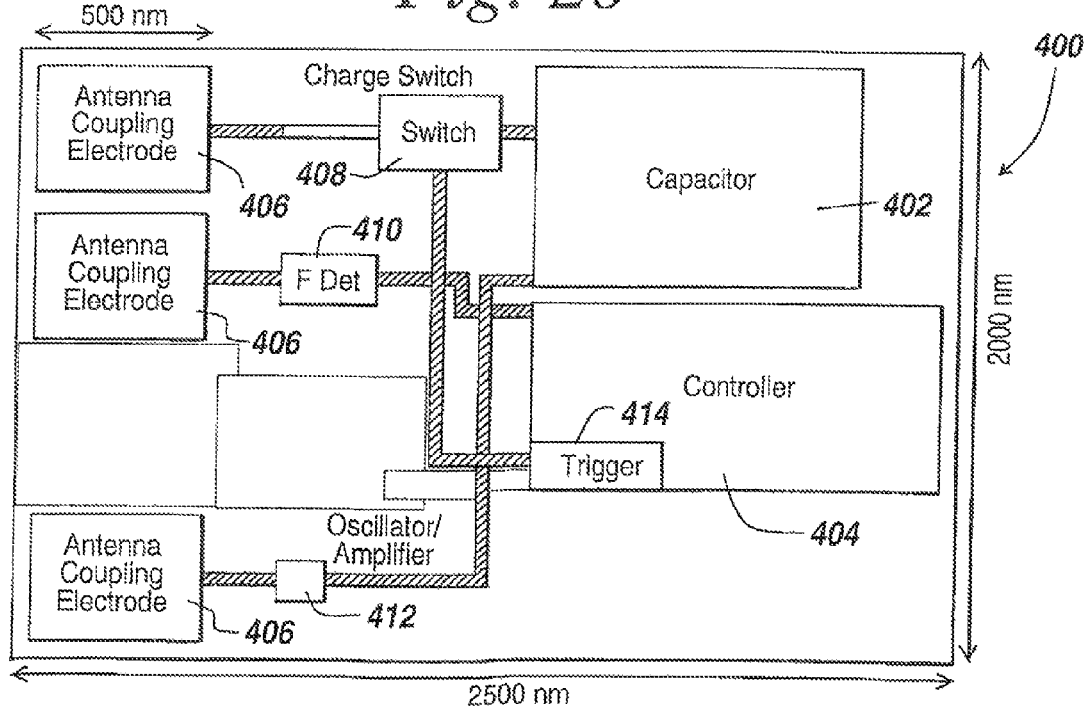
FIG. 20 is a diagrammatic illustration of the layout of a nanoscale microradio.

Based on these component estimates, it is possible to lay out a footprint estimate for the nanoscale microradio. FIG. 20 shows a 2000×2500 nm device 400 containing a complete microradio, including command receiver, rectifier and transmitter. The size is predominated by the energy storage capacitor 402, the controller 404 and the three coupling electrodes 406. Power dissipation and consumption are not issues as energy is drawn parasitically from the antenna, even between oscillator bursts. Weight is estimated at a few picograms ($10^{-12}$ grams) and the size is 2500 nm×2500 nm, clearly invisible to the unaided eye. Note that when embodied in nanoscale components, rectifier 408, frequency detectors 410, oscillator/amplifier 412 and trigger 414 do not contribute significantly to overall size. The two elements primarily determining device size are the energy storage capacitor and the antenna coupling electrodes.

Figure 21:
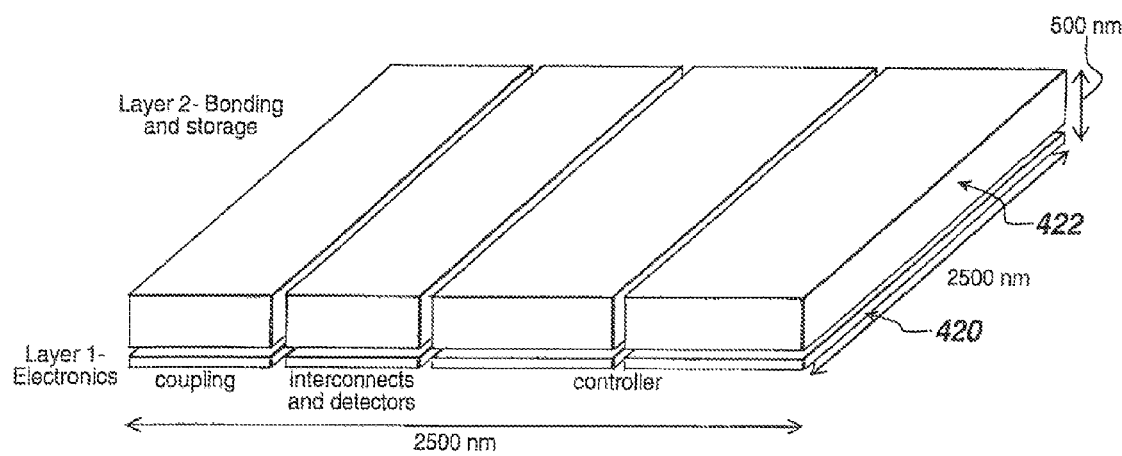
FIG. 21 is a perspective three-dimensional layout of a composite microradio in accordance with the subject invention.

A three-dimensional view is shown in FIG. 21. The design has two layers 420 and 422. The primary layer 420 holds most of the electronics. The second layer 422 is allocated for two functions. First, some sort of bonding agent is needed above the electrodes to ensure good contact with the target antenna. This contact can be mechanical, chemical, electrochemical, or some combination. The rest of the second layer provides additional room for a bank of energy storage capacitors.

What is provided by the subject invention is a crude, inexpensive, unobtrusive microradio whose non-optimal response can be compensated for both by the numbers of microradios and by having an exceptionally large aperture, high-power amplifier on the microradio reader so that large amounts of power can be projected towards the microradio ensemble to charge the inefficient small radios.

Massive Deployment Applications

Paint and Aerosol Dispersion

Referring now to FIG. 22, because of the possibility of making massive numbers of microradios, programming them and distributing them, it is possible to enable a large number of applications that could not be serviced utilizing single microradios.

In one embodiment one carries a slurry of microradios in a carrier as shown at 500 and supplies them in one embodiment to a paint sprayer 502, which forms a cloud of paint droplets 504 containing microradios that impinge upon a surface 506. This technique, may be used to coat many types of surfaces, including individual parts, vehicles, or other articles that require some kind of microradio assist, either in tracking, authentication, identification, sensing or the like.

As shown in FIG. 23, an aircraft 508 such as a crop duster may deploy a fog 510 of microradios entrained in an aerosol over the ground 512, with the microradios in one embodiment providing sensors with crop health information transmitted to a receiving antenna. Here the crop duster may be provided with a radio antenna, such as microwave horn 514, which can transmit powering signals to the ground as illustrated at 516, whereupon return signals with information on them are transmitted towards aircraft 508 as illustrated at 518.

Assuming that the microradios have suitable sensors, the same aerosol massive deployment of microradios can be used, for instance, in detection of improvised explosive devices, with the aircraft being able to power the microradios on the ground from, for instance, a distance of 100 feet, and receive the return signals.

Figure 24:
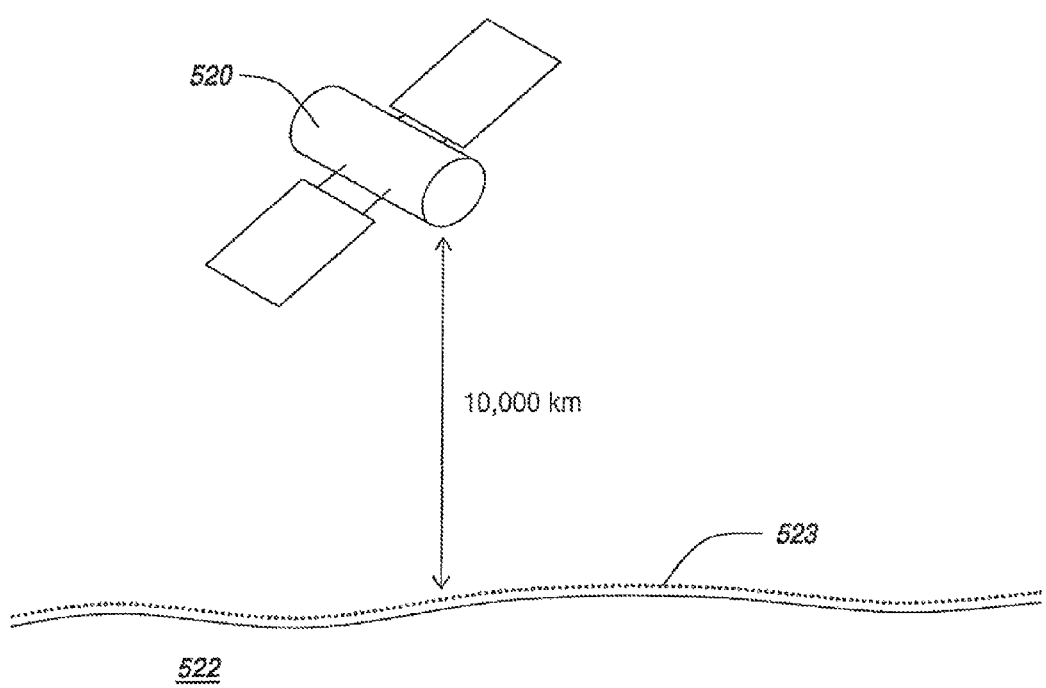
FIG. 24 is a diagrammatic illustration of the deployment of microradios over, for instance, an area that may have improvised explosive devices, with the area being overflown by a satellite that receives signals from the microradios from as much as 10,000 kilometers away.

Additionally and as will be discussed, as shown in FIG. 24, a satellite 520 may be used to overfly an area on the ground 522 and assuming that a paint or other coating containing microradios or aerosol-dispersed ensemble of microradios is available, with coherent processes that will be described, microradios if powered either by the ambient or some other parasitic means can be detected by the satellite at a distance of, for instance, 10,000 kilometers. Here the ensemble of microradios is shown by dots 523.

Coherent Operation and Multi-User Detection

Figure 25:
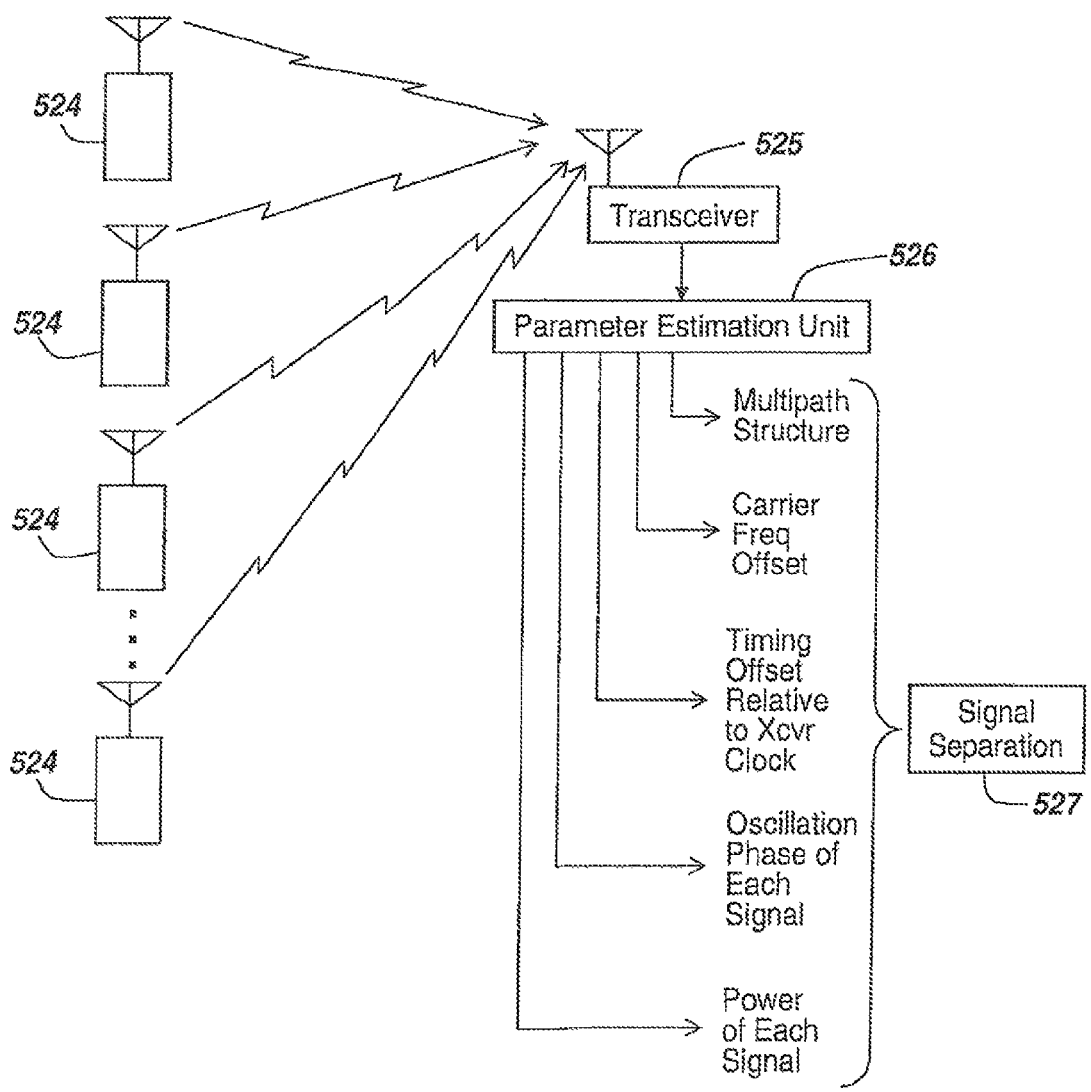
FIG. 25 is a block diagram of a multi-user detector system capable of being used when ensembles of microradios are deployed, illustrating the use of a parameter estimation unit in front of a signal separation unit.

Referring now to FIG. 25, when an ensemble of microradios is deployed either in a paint or other coating containing microradios or by aerosol projection, assuming that the radios are all operating on the same frequency due to the fact of their manufacture and due to the inability to easily program each of the microradios with a different operating frequency, multi-user detection techniques are employed. Multi-user detection techniques in general permit the demodulation of signals that are transmitted on the same frequency and using the same modulation type. It has been found that multi-user detection techniques such a described in U.S. Pat. No. 6,947,505 to Rachel E. Learned entitled "System For Parameter Estimation and Tracking of Interfering Digitally Modulated Signals," assigned to the assignee hereof, and U.S. patent application Ser. No. 09/923,709 filed Aug. 7, 2001 to Rachel Learned entitled "Method For Overusing Frequencies to Permit Simultaneous Transmission of Signals From Two or More Users on the Same Frequency and Time Slot," as well as U.S. Pat. No. 6,839,390 to Diane Mills entitled "Voting System For Improving the Performance Of Single-User Decoders Within an Iterative Multi-User Detection System." Other multi-user techniques are described by Robert MacLeod in U.S. patent application Ser. No. 10/105,918 filed Mar. 25, 2002 entitled "System For Decreasing Processing Time In an Iterative Multi-User Detector System," as well as U.S. patent application Ser. No. 10/134,330 filed Apr. 29, 2002 by Diane Mills entitled "Method and Apparatus For Random Shuffled Turbo Multiuser Detector."

What will be seen from this suite of multi-user detector cases is that, in a multi-user detection system in which interfering signals are purposely allowed to exist, a parameter estimation unit can be provided that utilizes signal processing for determining the channel transfer function for each received signal, including the received power, phase of the oscillator, timing offset relative to the base station clock carrier frequency, carrier frequency offset and a number of multipath replicas and delays for each replica, with the system providing real-time uninterrupted estimates of these parameters required by the signal separation unit.

Note that multi-user detection is described by S. Verdu in a book published by the Cambridge University Press in 1998.

Note that it is the purpose of the multi-user detection system utilizing a parameter estimation unit to be able to derive channel parameters that uniquely distinguish the characteristics of each individual signal regardless of the fact that the signals exist in the same communications bandwidth and at the same instant in time. These parameters are required by any signal separation system for highly loaded or overloaded systems of users and in general include, for each signal, the channel transfer function comprised of the received power, the phase of the oscillator that generated each received signal, the timing offset relative to base station clock, any frequency offset of the carrier, and the structure of the multi-path replicas.

As described in this patent, the received power of the signals varies substantially from burst to burst, which means that the parameter estimation becomes somewhat difficult. Likewise the phase of the oscillator can also vary from burst to burst, as can the timing offset, which is the variance of when the signals are to be received in a particular timing slot of the communications system. Conversely, the burst length is usually known to within a fraction of a symbol period. Not only can all of these parameters change on a burst-by-burst basis, the frequency of the carrier can also change, most notably due to Doppler shifts and thermal drift.

The result is that signal separation become increasingly difficult in the changing environment where a number of the microradios are trying to communicate with the base station on the same channel.

Note, for multi-user detection systems there is a need to be able to dynamically adapt to the changing signals occasioned by the fact that one cannot dictate the fixed nature of the transmitters and to the fact that the power adjustment for each of the transmitters in one embodiment is adjusted by the base station, sometimes on a burst-by-burst basis. This case is the same when multi-user detection is applied to microradios.

Moreover, it is important that a multi-user detection system be able to operate with various coding schemes and various error interfaces.

In this patent, in order to be able to accommodate multiple interfering signals on the same communication channel in which the signals are purposely allowed to interfere with one another, to be able to make maximum use of a traffic channel, initial estimates are made of various parameters utilizing the interference-free receive signal on an acquisition channel and the usual traffic channel training sequences that are transmitted to identify each mobile user and to set up timing for the burst transmission from the microradio. In the case of microradios, acquisition channels may be defined by individually addressing radios in order to obtain a comparatively uninterfered transmission from the microradio. In this case, many parameters can be estimated and stored for future detections. Such an approach would be of most value for embedded sensor applications and other applications where multiple interrogations of the same radio are most desirable.

It is a feature of the Learned invention that with the estimate of various parameters, signal separation can in fact take place.

Not only is the multi-user detection system usable with various coding schemes, it is also usable with the BFSK modulation scheme for the microradios. As can be seen in FIG. 25, each of the microradios, here illustrated at 524, transmits to a transceiver 525, which is utilized not only to parasitically power the microradios but is used to receive the transmission from the microradios.

Each of the microradios has certain characteristics even though they are transmitting on the same frequency at the same time. These characteristics are coupled to a parameter estimation unit 526, which through processes described in the Learned patent provide estimates of power of each of the signals, oscillation phase of each signal, timing offset relative to the transceiver clock, carrier frequency offset and multipath structures. Having these parameters estimated, one can use either conventional multi-user detection techniques in signal separation unit 527 or more sophisticated signal separation techniques described in the aforementioned patents and patent applications.

It is important to note that if each of the microradios in an ensemble of microradios transmits at a different time, then it is possible to demodulate the information content from an individual microradio. Timing, however, for such a read-out of the microradios is somewhat problematic due to the fact that it may not be easy to control when each of the microradios transmits. Thus time division multiplexing, while possible with a paint or other coating containing microradios or aerosol-dispersed ensembles of microradios, is not as robust as would be liked.

On the other hand, it is possible through transmissions from transceiver 525 to issue control signals to the microradios to have the microradios transmit coherently, meaning that they are on and off at the same time and transmit on the same frequency. Using this controlling technique, it is even possible to assign time slots to each microradio so that they transmit at separate times. However, multi-user detection techniques may be preferable in cases where it is possible to use such sophisticated digital demodulation techniques to separate interfering signals.

While it would be thought that it would be impossible to disambiguate the signals or separate them, the aforementioned multi-user detection techniques when applied to BPSK or other modulation schemes utilized by the microradios permits the demodulation of all of the coherently actuated microradios.

Thus even if the radios are coherently operated, the multi-user detection techniques provide a way to separate out the signals and to provide a readout of the information from each of the microradios.

Even if the microradios are all transmitting the same information, it is nonetheless important to be able to utilize multi-user detection techniques. It is noted that each of the microradios is provided at the factory with a unique serial number, primarily to permit identification of the signals from each of the individual microradios. This being the case, even though the information from the microradios may be the same, the identity of the microradios is still important.

Thus coherent operation may be important for the abovementioned crop health scenarios, improvised explosive device scenarios, or the identification and tracking of objects such as vehicles, animals or any place where a single microradio will not function properly.

It is also possible with coherent operation of the microradios to provide the aforementioned power augmentation by a factor of $n^2$, where n is the number of microradios transmitting coherently, so that, for instance, ensembles of microradios, rather than having to be detected at close range, can be detected either by overflying aircraft or in some cases by satellites at 10,000 km.

Manufacture

As to the manufacturing of the microradios, they can be manufactured on, for instance, a 200-millimeter wafer and can be chemically scribed and broken up to provide almost infinitesimally small particles that are then distributed in a slurry, aerosol spray, or a paint or other coating containing microradios and are used to coat an object for which information is desired.

The use of a wafer, photolithographic patterning and etching techniques provides the 10-micron structures that, when made, can be pre-programmed with serial numbers during the manufacturing process.

More particularly, the radios are printed on a wafer using conventional semiconductor processing techniques. Scribing lines are printed on the wafer to delineate each microradio. A chemical etches through each scribing line to break up the wafer into small radio particles. The particles are then coated with a thin conducting layer. By pouring the particles on a conducting surface, the microcontroller inside each radio can receive a programming signal to load the serial number or perhaps other data or software inside the microradio control unit. In this manner, the identity of each particle is known. It would also be possible to program the radio serial number at the time of semiconductor printing. However, in this case, changing the radio data requires fabrication of a new reticle which is likely more expensive than programming the particles on a conducting plate.

Figure 26:
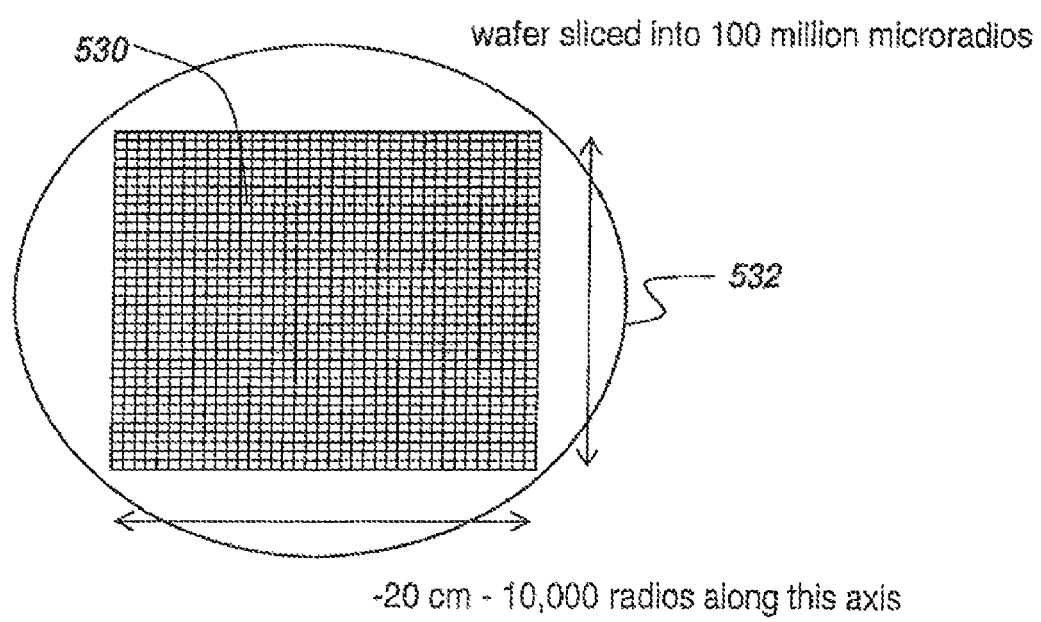
FIG. 26 is a diagrammatic illustration of the manufacture of large numbers of microradios, using a wafer sliced into 100 million microradios, with the microradios occupying a square area on the wafer of 20 centimeters to produce 10,000 microradios along an axis.

Referring now to FIG. 26, in one embodiment each radio 530 is sized to transmit ten microwatts: storage capacitor drives size. A radio contains a storage capacitor and less than 10,000 CMOS components. Using 50 nm CMOS, each radio is <20 micrometers. 10,000 radios fit along each axis of a 200 mm wafer. 100 million radios are obtained from a single $100 wafer. Each radio may cost one micro-dollar.

Figure 27:
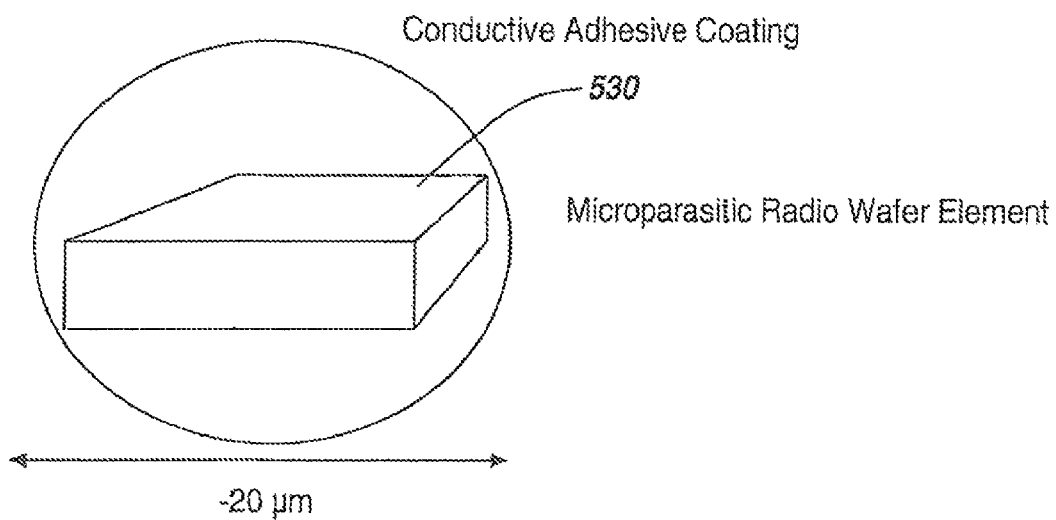
FIG. 27 is a diagrammatic illustration of a microradio formed in the manufacturing process of FIG. 26, in which the microradio is provided with a conductive adhesive coating about the microparasitic radio wafer element.

Here the wafer 532 is cut into 100 million components 530, one of which is shown in FIG. 27. Each part is coated with a conductive adhesive. Coated radios are dissolved in dilute grease or aerosol. The surface tension of the coating creates a spherical shape. In the coating procedure the wafer element is coated in $SiO_2$ or other insulator except for antenna coupling spots. Next, the wafer is coated with conductive adhesive.

Placement techniques for the radio particles of the present invention include UAV aerosol, munition aerosol, and manual grease.

Methods for Tracking Metal Objects Using Microradios

In the aerosol placement technique of FIG. 24, a preferably large aircraft flies upwind. The aircraft releases smaller guided UAV or pod able to home on specific coordinates the pod sprays aerosol at the target. Remote commands will then verify successful radio placement. After a radio is charged, it radiates a coded pulse to demonstrate successful operation. Conventional geolocation processing may be employed to verify radio location. Applicable techniques including angle-of-arrival determination using an antenna array, a swept beam or monopulse processing, and ranging using time of arrival estimation among many other possible geolocation techniques.

Manual application of radio grease allows the radio grease to coat metal objects, vehicles, and other equipment. The microradios are powered by ambient RF for long-range polling.

Figure 28:
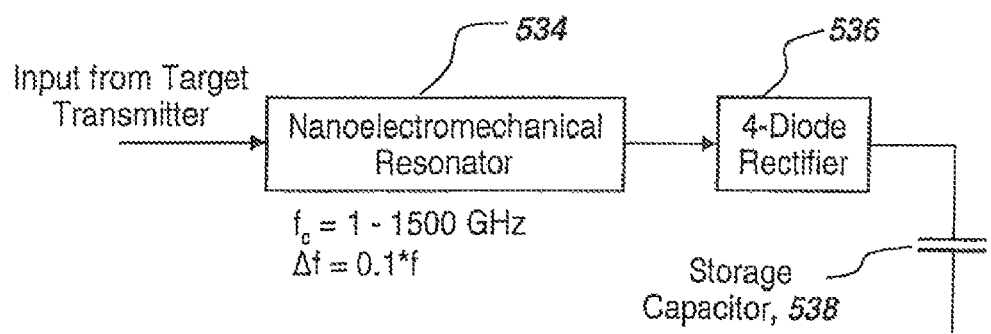
FIG. 28 is a block diagram of a nano-electromechanical resonator coupled to a four-diode rectifier for the filtering of input signals to the rectifier of a microradio.

Referring to FIG. 28, parasitic energy extraction and storage is illustrated. Here a resonator 534 is coupled to a four-diode rectifier 536 output to a capacitor 538. High-dielectric parallel plate capacitors are fabricated using $BaTiO_3$. The size is about 10×10×10 μm. Parasitic energy extraction will be most efficient. Alternatively solar or remotely beamed energy charging could be incorporated. Other means are possible if very low duty cycle operation is required.

It will be understood that electromagnetic coupling is effected in some applications of the present invention by a microscopic device functioning as electrode, not as a radiating element. The microscopic device is physically or capacitively coupled to a macroscopic body such as a metal antenna, metal object, or a lossy dielectric, e.g. a mammal. While the isolated microradio antenna gain is proportionate to $(d/\lambda)^2$ which could be −80 dBi or less, coupled parasitic microradio gain ranges from typically −10 to +10 dBi depending on where the microradio is placed.

Note that encapsulation may be accompanied by one of two modes, which are a nonvolatile mode and a volatile mode.

Figure 29:
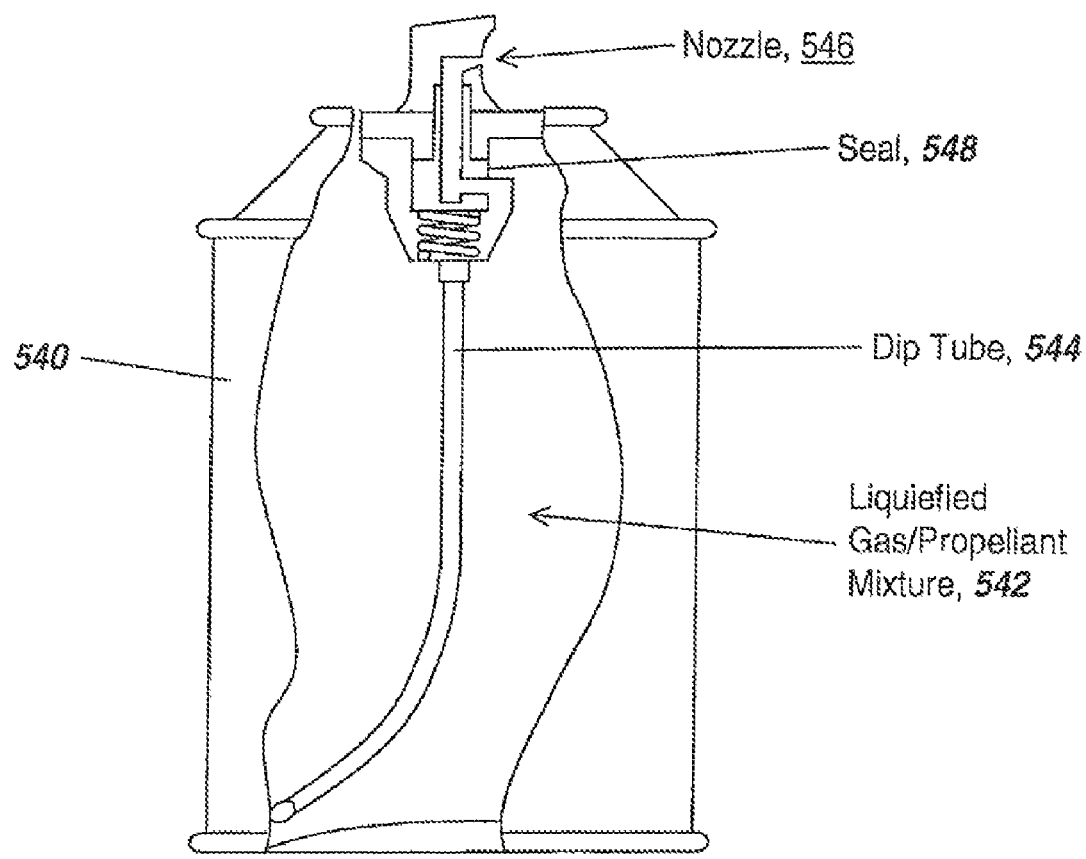
FIG. 29 is a diagrammatic illustration of an aerosol can into which paint or other coating containing microradios has been loaded, indicating that with the use of a gas propellant and a high vapor pressure binder, conductively coated microradios can be dispersed as an aerosol from the can.

Referring to FIG. 29, in the nonvolatile mode, micro-radios are dissolved into a material, and a permanent coating is applied to a surface. The surface may be, for example, metal, plastic or skin. To manufacture such a radio, aerosol radios are diluted in preferably non-toxic solvent that is mixed with aerosol propellant. The resulting mixture is placed in pressurized vessel: aerosol can 540, UAV sprayer or similar housing having a liquefied gas/propellant mixture 542, a dip tube 544 that goes through a seal 546 to a nozzle 548. Radios are the same size as floating dust particles or fog droplets (5-40 μm). The solvent evaporates on contact leaving a sparse radio coating. Each radio is sized to transmit microwatts.

Authentication

It will also be understood that the method and apparatus of the present invention can also be used to authenticate documents, objects or people. A polling device transmits a secure coded waveform and possibly a charging signal to power up the radio particle. The radio particle responds to the secure code waveform with its serial number. Comparing the serial number to the secure database authenticates the item. Currency scanners can be developed using the same technique.

In all cases, shared key encryption is needed to prevent a third party from pirating the polling waveform.

Figure 30:
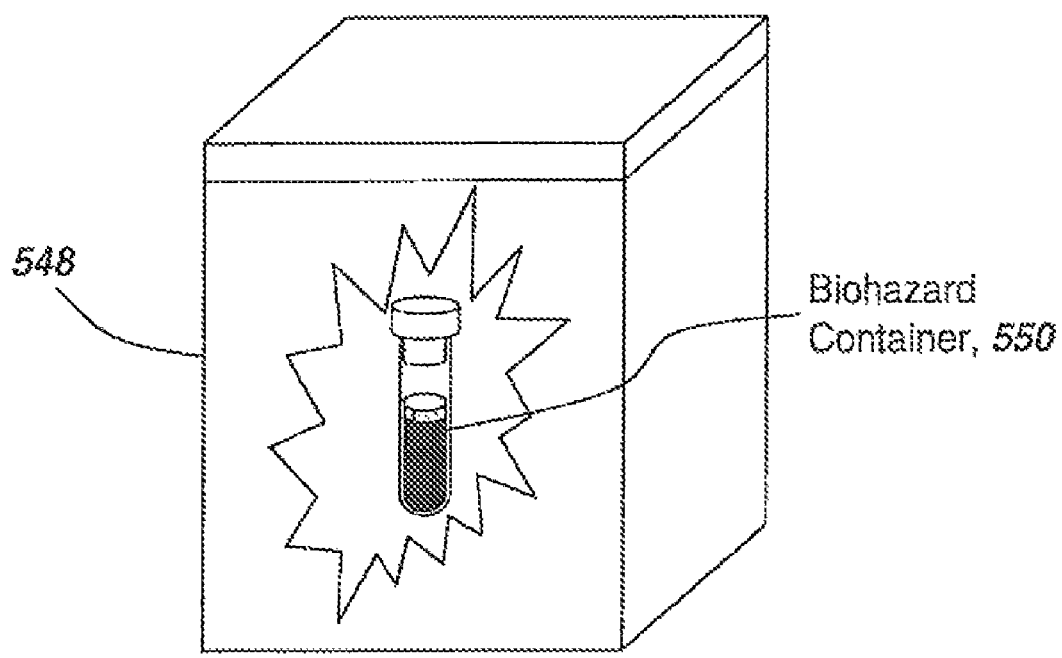
FIG. 30 is a diagrammatic illustration of the authentication and tracking of a biohazard container within a further container, with unauthorized entry of the biohazard container being detected through the escape of microradios in an aerosol housed about the vial in the container, assuming that the vial in the container has been violated, thus indicating the violation of either the carton or the vial through the escape of microradios, which are detected at some distance from the container.

Referring to FIG. 30, in the volatile mode a box 548 contains painted article 550. The article is painted with a paint or other coating containing microradios to enable remote identification and authentication. At the same time, the container is sealed and floating in the air inside the container is a high vapor pressure solvent containing small radio particles. In this case, opening the box releases microradio vapor onto an intruder for tracing and attribution.

Coding

It will be appreciated that burst communication may be accomplished by means of the method and apparatus of the present invention. 50 nm CMOS logic provides ample space for transistors with, for example 100 transistors per square micrometer. Digital logic provides enhanced functionality by means, for example, of timers, decoders, waveform generators.

Figure 31:
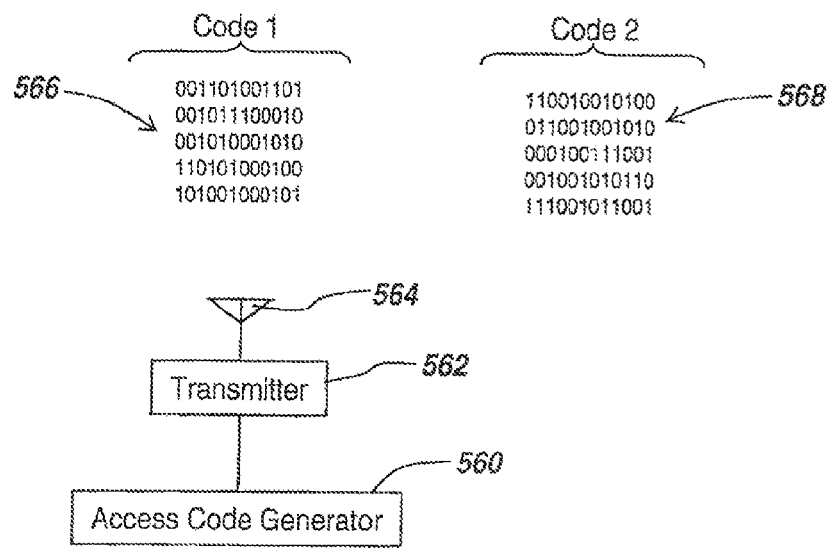
FIG. 31 is a diagrammatic illustration of the ability to access different classes or subclasses of the ensemble of microradios in which two different classes or subclasses can be accessed through an access code generator coupled to a transmitter that transmits the access codes to selected classes or subclasses of microradios.

Referring to FIG. 31, covert tagging and tracking may also be accomplished by means of the method and apparatus of the present invention, wherein each radio contains a unique 30-100+ digit serial number and access code. Radios only respond to messages containing correct access code from an access code generator 560 coupled to a transmitter 562 and to antenna 564, and appropriate address fields which enable tracking down to an individual microradio. The subject system also enables sorting into user-defined radio groups as shown by microradio ensembles 566 and 568.

Monitoring

Figure 32:
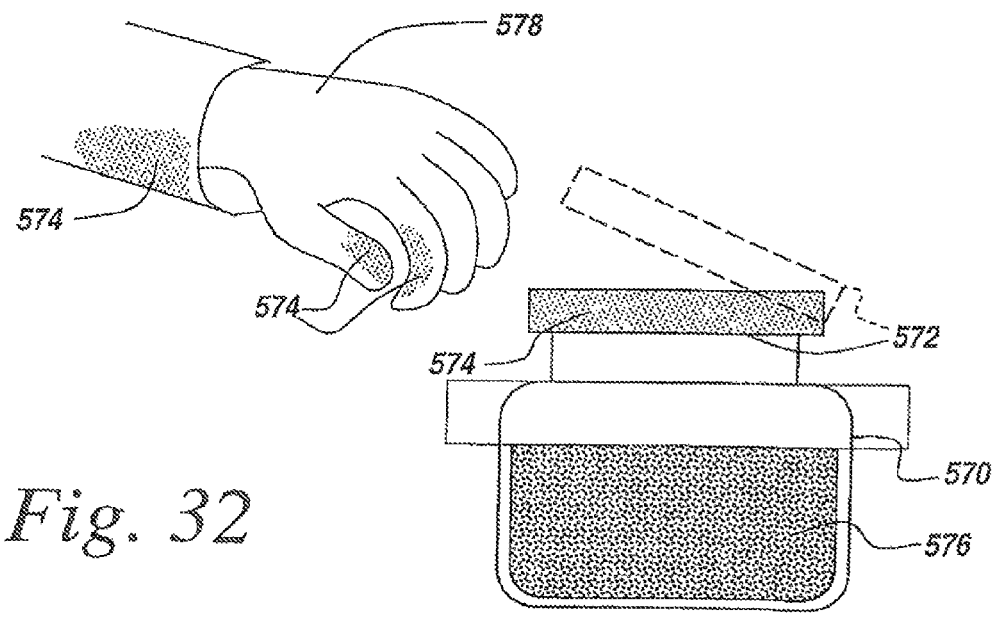
FIG. 32 is a diagrammatic illustration of the authentication and coding of a container with a paint or other coating containing microradios on the lid of the container, with the escape of the contents of the container also being determined due to the violation of the container.

Referring to FIG. 32, the use of the method and apparatus of this invention to monitor sensitive objects may also be accomplished. For example, a container 570 may be provided with a spray-on biohazard container lid 572. Container lids 572 contain adhesive radios 574. Container 570 may contain volatile radios 576 for sealed containers. Polling container serial numbers verifies that biohazards are still safely stored. Polling enclosure numbers will detect presence of radios on skin and clothing of personnel 578 who opened sealed containers. Such tagging may be applied, for example, to hazardous containers.

Tracking of Animals and Objects

Figure 33:
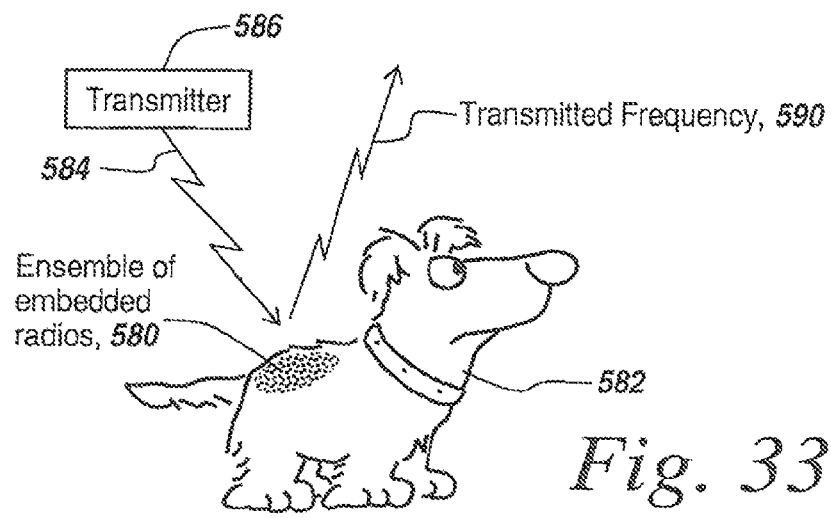
FIG. 33 is a diagrammatic illustration of a pet tracking embodiment in which microradios are embedded in or attached to an animal to provide a tag so that the animal can be traced.

Referring to FIG. 33, those skilled in the art will appreciate that it would be desirable to implant very small radios directly onto the bodies of animals in order to track their whereabouts. On first look, the 20-micrometer particle size makes detection of an embedded radio extremely difficult.

2 GHz is a desirable communication frequency for radios 580 embedded in an animal 582. It is important to model the body as a dielectric lossy conductor in order to understand communication link parameters associated with communicating with animals. 2 GHz has been found to be a good compromise between the losses incurred in the body at lower frequencies and the loss of efficiency of the rectifying diodes at higher frequencies.

The communications protocol operates similarly to radio frequency identification tags. A polling signal 584 from a transmitter 586 charges the device. It may also be possible to charge the device from ambient radiation, especially in urban areas. Upon detecting the polling signal, the radio responds with a short transmission burst 590. This burst contains enough data to identify the serial number of embedded radio. This serial number is indexed into a data base in order to identify the carrier of the embedded radio particle.

It will also be understood that other tracking applications may be easier to implement due to shorter range requirements. In these cases, more power is available to poll the particle in order to power the radios and to receive identification bursts. The four examples shown are provided as initial applications. They are not all-inclusive.

Figure 34:
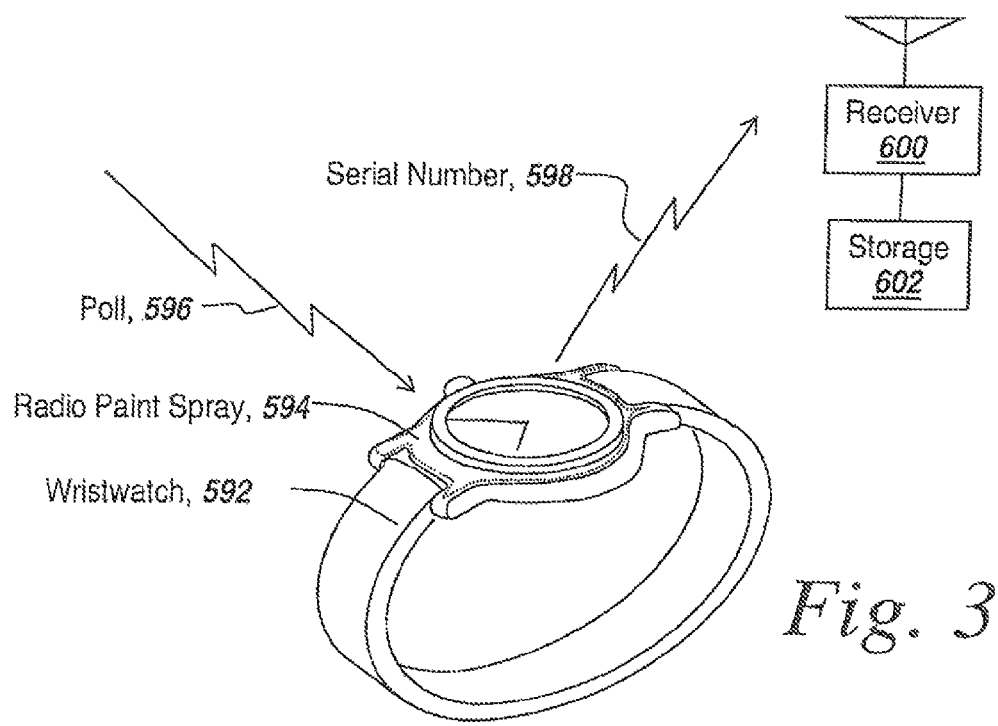
FIG. 34 is a diagrammatic illustration of the authentication and tracking of an object such as a watch, in which a paint or other coating containing microradios is applied to the watch during manufacture, with the radios being polled and the serial numbers thereof read out by a receiver and stored so as to be able to track and authenticate an object.

Referring to FIG. 34, the method and apparatus of the present application may also be used to track metal objects such as a watch 592. The paint or other coating containing microradios spray 594 described above will covertly tag and track virtually any metal object. Chemicals added to the spray can microscopically weld the radios into the metal without visual alteration. After spraying the object, polling it via signal 596 logs the serial numbers of particles embedded on the metal by emitted signals received at 600. The serial numbers are stored in a database at 602 for future reference. Thus, for instance, if metallic objects are uncovered in other locations, polling it can trace the source. This information can help uncover security problems.

Figure 35:
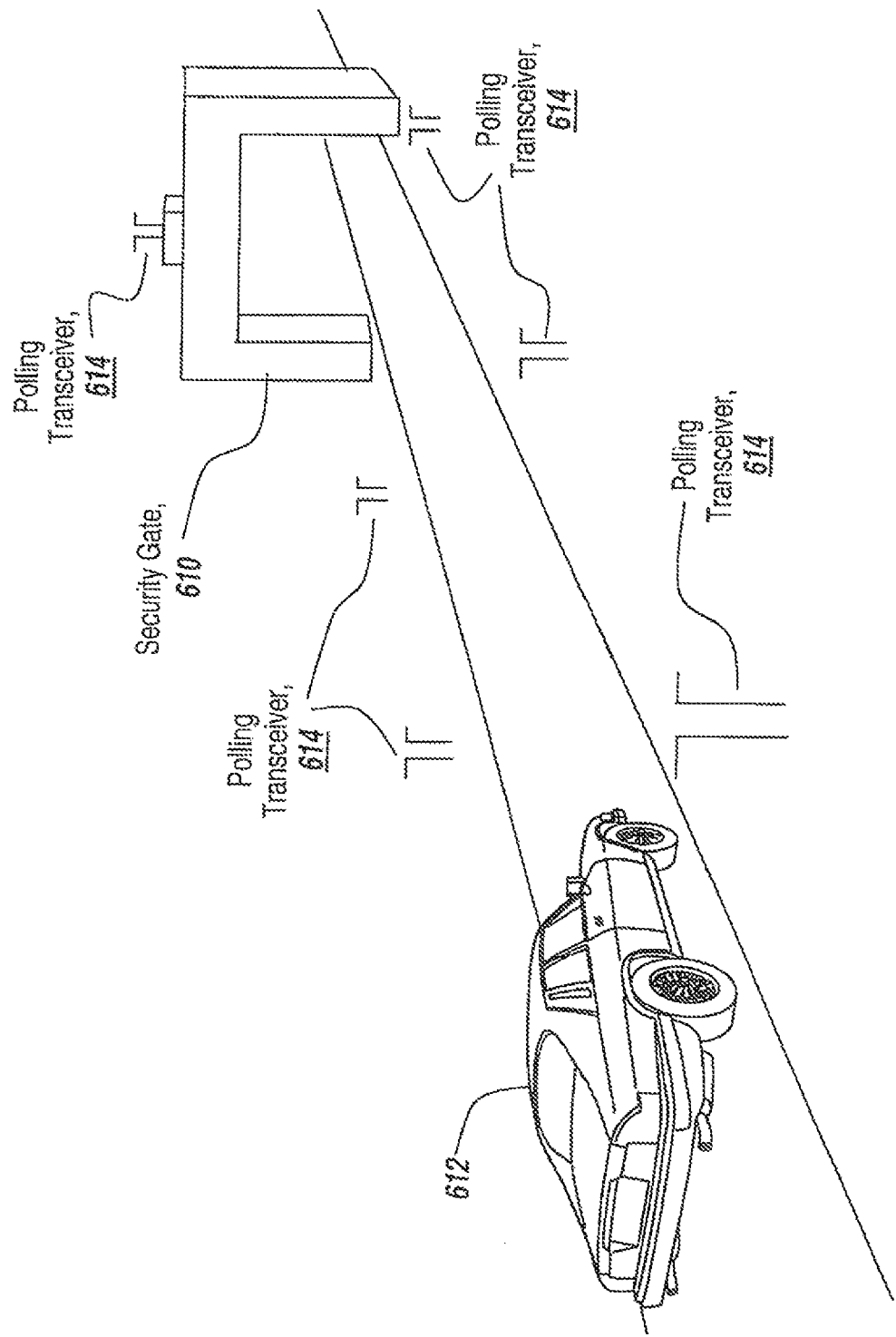
FIG. 35 is a diagrammatic illustration of the utilization of microradios on a vehicle or container in which the microradios are tracked as the vehicle approaches a checkpoint through the utilization of transceiver antennas embedded on the road approaching the polling point.

As illustrated at FIG. 35, at border crossing and other security gates 610, radio polls involving a polling transceiver 614 identify vehicles 612 well in advance of the actual encounter. Alternatively, polling antennas 614 placed several kilometers along the road will provide guards with specific details of impending threats.

Harbor security is enhanced in a manner similar to other border crossing. A ship-mounted polling system can identify high-threat vessels approaching coastal areas including urban harbors with vulnerable targets for terrorist acts. Shipping containers can also be tagged.

Other metal objects to be tracked in this manner include vehicles, machinery and chemical storage containers. This method can be used to inexpensively label products in which a paint or other coating containing microradios spray is applied to a foil patch imprinted on the package.

A recent experiment showed that a microprobe effectively coupled into a metal object provided substantially more gain than free space radiation of the same microprobe. The probe injected a 1 mW 3 GHz current into an aluminum case. Received power was −69 dBm, 7 dB more than was received from the isolated probe.

As part of the subject invention, a method is described in which microradios are implanted in or on an object to be authenticated.

Embedding

The method and apparatus of the present invention may also be used in embedded sensors. Currently, many organizations are developing nanometer-scale sensors for measuring and detecting physical, chemical and biological quantities. Examples include chemical sensors as, for example, for Na, Cl, organics and inorganics; physical sensors, as, for example, for stress, strain, pressure, voltage and charge; and biological sensors as, for example, viruses, bacteria, cancer cells and DNA. In each case, the small size of the sensor creates a problem in transmitting to and receiving from the sensor. Attaching a radio particle solves this problem by enabling remote access to the sensor. The radio particle provides batteryless power through its charging circuit, commands and other input information through its receiver and a sensor data downlink through its transmitter to transmit sensor data from remote locations.

Measuring Flow in Nonmetallic Pipes or in Humans or Animals

Figure 36:
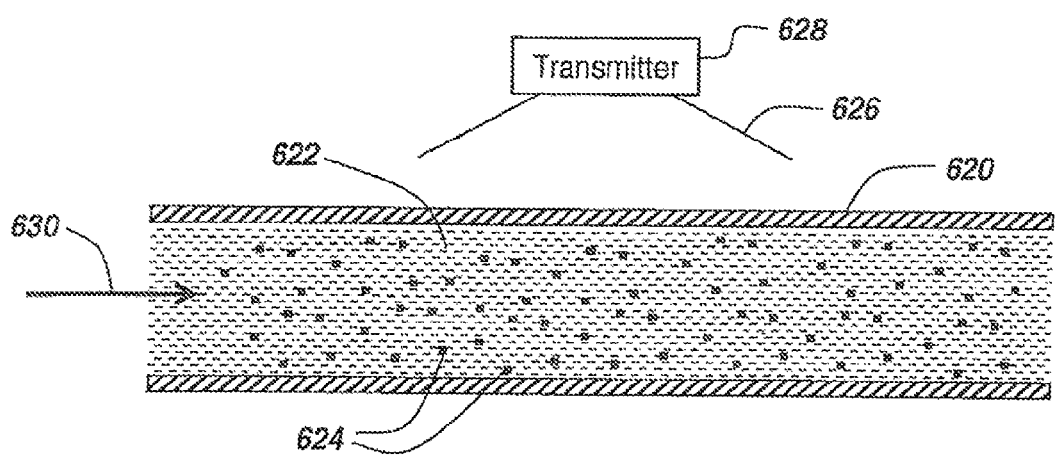
FIG. 36 is a diagrammatic illustration of the sensing of fluid flow through the utilization of non-conductive conduits or pipes and the embedding of microradios in the fluid.

Referring to FIG. 36, a nonmetallic pipe 620 includes a liquid 622 in which are entrained microradios 624 that produce emissions when irradiated by energy from, for instance, a horn antenna 626 coupled to a transmitter 628, which is used to parasitically power the microradios in the fluid that is moving along the pipe in the direction of arrow 630. By so doing and utilizing emitter location and visualization techniques, one can determine fluid flow and indeed properties of the fluid as it moves within the nonconducting pipe.

Thus it will be understood that the method and apparatus of the present invention can be used for imaging flow in nonmetallic pipes. Emitter Location and Visualization Systems (ELVIS) techniques can locate a radio source to one-quarter wavelength. Using current NEMS technology to build a highly stable and miniature oscillator, one can anticipate building a 3 GHz device in the near term. This corresponds to 25 mm ELVIS resolution. Dissolving radio particles in a fluid would make it possible to image the particles to this resolution as they flowed through a pipe. Time-dependent imaging would provide flow measurement inside the pipes, thereby providing non-invasive flow measurement and blockage identification.

This technique also applies to mammals and humans. ELVIS can monitor and measure digestion, blood flow and air flow using radio particles. It could provide a far less expensive alternative to cardiac catheterization, a hospital procedure used to measure blood flow and to detect blockages in coronary arteries. About 100,000 cardiac catheterizations are performed annually, each costing about $20,000.00.

Future nano-electromechanical systems (NEMS) resonators are predicted to increase the transmission frequency to at least 15 GHz, providing 5 mm resolution.

Treating Diseases Including Cancer

Figure 37:
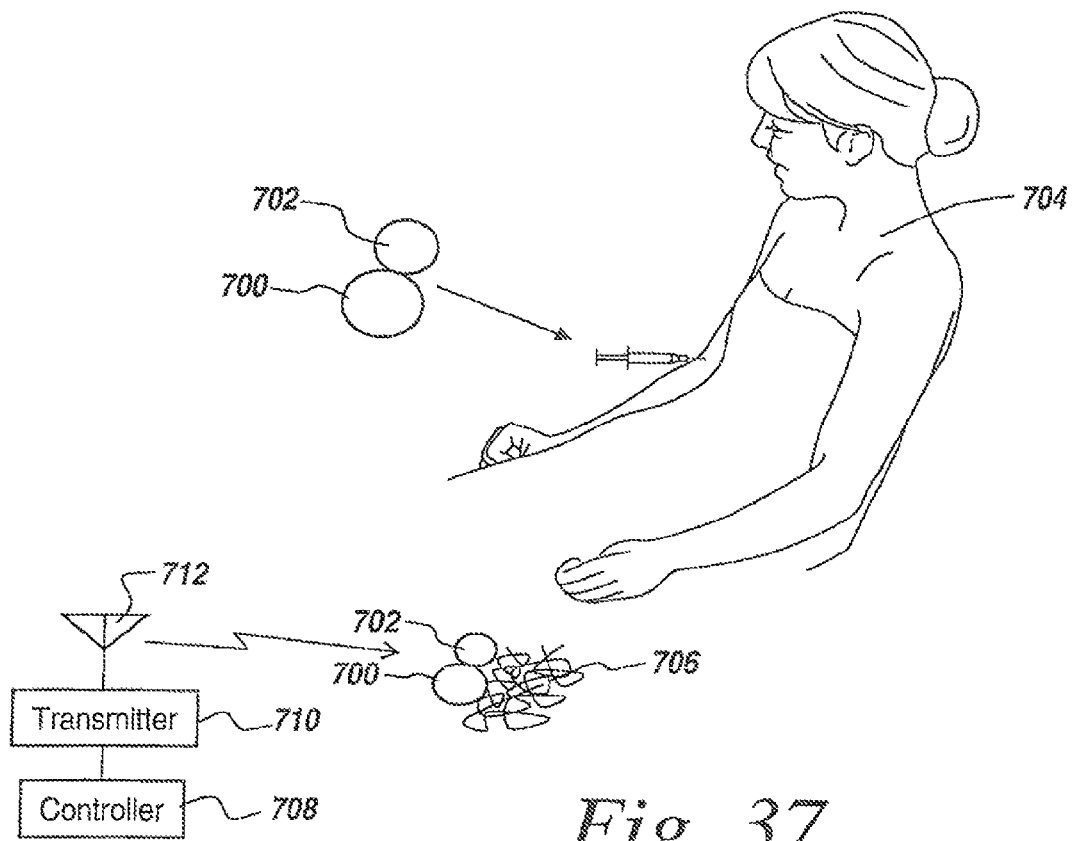
FIG. 37 is a diagrammatic illustration of the tagging of cancerous proteins with a molecule having associated with it a microradio, such that microradios containing molecules are injected into the body of a patient, followed by parasitic powering of the microradios from outside the human body; and, FIG. 38 is a diagrammatic illustration of the powering activation and current discharge of the microradio of FIG. 37 from a controller such that the current discharge diminishes or destroys the protein and thus the cancer-causing agent in the patient of FIG. 37.
Figure 38:
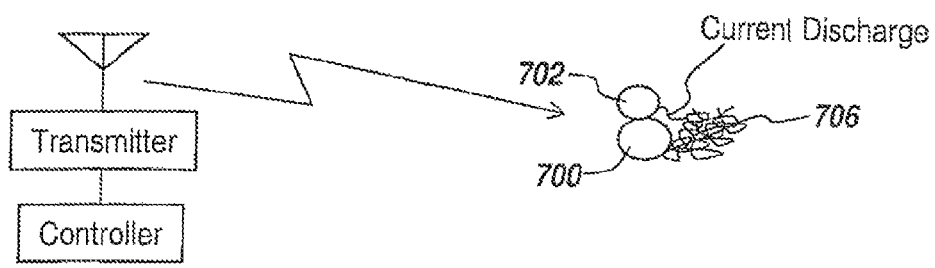

Referring to FIGS. 37 and 38, the present invention also encompasses a method for treating cancer. In this method a receptor molecule 700 that may be referred to as a biomarker as is described by U.S. Pat. No. 5,728,579 which is attached to a microradio 702, which is preferably a radio particle as is described herein that is also equipped with a capacitor and a switch. Receptor molecules and microradios are injected into a human body 704, after which the receptor molecule attaches to a malignant protein 706, also known as a cancer marker, on a malignant tumor. There is a controller 708 outside the body that is connected to the microradio by a wireless link using transmitter 710 and antenna 712. The microradio is attached to the malignant protein. As shown in FIG. 38, the controller goes through a charge phase, a poll phase and a fire phase, which causes the microradio and capacitor combination to discharge current to the malignant tumor to reduce the size of and eventually eliminate the tumor.

In summary, the techniques of high-density fabrication of micro-sized radios coupled with encoding during manufacturing and distributing via liquid or aerosol, together with the use of a hysteresis switch and various types of gain-enhancing antennas, result in the ability to massively deploy a large number of almost invisible microradios that act in concert to provide enough range to be useful for a wide variety of applications.

Regardless of how power is parasitically supplied to the microradios, what is important is to deploy an ensemble of radios, charge them, radiate back coherently from them and detect their signatures, including the information that is encoded in the microradio.

Note, if multiple microradios are made to operate in a coherent fashion, then there is an $n^2$ power advantage to give the ensemble of microradios ranges that exceed 10,000 kilometers such that these radios can be heard by satellites.

It will be noted that if all or selected numbers of the radios are made to operate in a coherent fashion, then one has the $n^2$ power advantage. It has also been found that multiple coherently driven radios can be separately demodulated utilizing multi-user detection techniques in which radios operating on the same frequency with the same modulation type can have their transmissions separated out so that the information on each of the signals can be separately demodulated and understood.

Because of the use of so many microradios over a given area, antenna matching is not a problem, whereas exotic antenna materials such as ferromagnetically loaded loops can be used to increase the gain of the microradios.

Such ensembles of microradios can be used to authenticate a document or item where microradios can be embedded in the document or item, and scanned, for instance, only two inches away. When scanning close in, one mitigates free-space loss, such that if there is, for instance, one kilowatt shining towards the ensembled radios, the efficiency of the radios is not at issue.

For interrogation at a distance the techniques described herein permit remote powering and polling by, for instance, overflying at 100 feet with a high-power transmitter.

Moreover, optimal charging cycles help power the radios, with simultaneous charging at different frequencies permitting a better concentration of power to exceed diode thresholds.

The microradios may be used, for instance, in object identification when dispersed over natural radiative structures, and can be used for anti-piracy by coating valuable objects with paint or other coating containing microradios. For instance, expensive watches can be coated with microradios. Microradios can also be used to tag animals.

Moreover, shared key encryption can be used in which the interrogation key must be present in order to read out the information from the microradios.

Further, tracking can be achieved at choke points or by specialized readers in some instances.

Note that packaging can be overprinted with radio ink, or containers can be coated with encrypted microradio material. Additionally, microradios can be embedded in the material itself so that they can be detected no matter where used. Authentication is also possible through polling for specific RP signatures and multi-user detector technology can be used to separate out returns from different radios operating on the same frequency.

The microradios are so small they can be used in measuring fluid flows in large pipes or in small structures such as arteries, e.g., for venograms or echocardiograms; and can be used in drug delivery systems in which tagging molecules are provided with microradios that cause local drug release upon activation.

While the present invention has been described in connection with the preferred embodiments of the various figures, it is to be understood that other similar embodiments may be used or modifications or additions may be made to the described embodiment for performing the same function of the present invention without deviating therefrom. Therefore, the present invention should not be limited to any single embodiment, but rather construed in breadth and scope in accordance with the recitation of the appended claims.

What is claimed is:

1. A method for manufacturing a micro radio comprising the steps of:
   cutting a wafer of silicon into a plurality of components;
   coating each of said components with a conductive adhesive; and
   coupling a hysteretic switch with each of said components, wherein said hysteretic switch further comprises two transistors.

2. The method of claim 1, wherein the wafer is cut into at least about 10,000 components.

3. The method of claim 2, wherein the coated components are dissolved in a dilute grease or an aerosol.

4. The method of claim 1, wherein the components reach a spherical shape due to surface tension.

5. The method of claim 1, wherein each component has an antenna.

6. The method of claim 5, wherein the antenna is a monopole antenna.

7. The method of claim 5, wherein the antenna is a dipole antenna.

8. The method of claim 7, wherein the length of the dipole antenna is commensurate with the size of the microradio.

9. The method of claim 5, wherein the antenna is a magnetic dipole antenna comprising a microcoil staircase.

10. The method of claim 9, further including inserting a magnetically permeable material inside the microcoil staircase.

11. The method of claim 1, further comprising pre-programming each of said components with a serial number.

12. The method of claim 1, further comprising attaching a modulated oscillator and a receiver section to each of said components.

13. The method of claim 1, further comprising attaching a rectifier to each of said components.

14. The method of claim 13, further comprising attaching an oscillator to each of said components.

15. The method of claim 14, further comprising coupling at least one capacitor to the oscillator with said hysteretic switch.

16. The method of claim 15, further comprising coupling a receiver between said hysteretic switch and the oscillator.

17. The method of claim 14, further comprising coupling at least one modulator to the oscillator.

18. The method of claim 13, wherein the rectifier includes a voltage multiplier.

19. The method of claim 1, further comprising dispersing said components over a naturally radiative structure.

20. A method for manufacturing a micro radio comprising the steps of:
   cutting a wafer of silicon into a plurality of components;
   coating each of said components with a conductive adhesive;
   attaching a rectifier to each of said components
   attaching an oscillator to each of said components; and
   coupling at least one capacitor to said oscillator with a hysteretic switch, wherein said hysteretic switch comprises at least two transistors.

* * * * *